United States Patent
Babic et al.

(10) Patent No.: US 8,796,843 B1
(45) Date of Patent: Aug. 5, 2014

(54) RF AND MILIMETER-WAVE HIGH-POWER SEMICONDUCTOR DEVICE

(75) Inventors: Dubravko I. Babic, Santa Clara, CA (US); Quentin E. Diduck, Ithaca, NY (US); Alex Schreiber, Campbell, CA (US)

(73) Assignee: Element Six Technologies US Corporation, Santa Clara, CA (US)

( * ) Notice: Subject to any disclaimer, the term of this patent is extended or adjusted under 35 U.S.C. 154(b) by 296 days.

(21) Appl. No.: 12/855,274

(22) Filed: Aug. 12, 2010

Related U.S. Application Data

(60) Provisional application No. 61/233,390, filed on Aug. 12, 2009.

(51) Int. Cl.
*H01L 23/48* (2006.01)
*H01L 23/34* (2006.01)

(52) U.S. Cl.
USPC ............ 257/718; 257/694; 257/707

(58) Field of Classification Search
USPC .............. 257/294, 694, 666, 688, 707, 718
See application file for complete search history.

(56) References Cited

U.S. PATENT DOCUMENTS

| | | | |
|---|---|---|---|
| 5,146,314 A * | 9/1992 | Pankove ................ | 257/712 |
| 2005/0156291 A1* | 7/2005 | Shiu et al. .............. | 257/666 |
| 2009/0321125 A1* | 12/2009 | Brodsky et al. ......... | 174/263 |
| 2010/0123225 A1* | 5/2010 | Gruenhagen et al. ... | 257/666 |

* cited by examiner

*Primary Examiner* — Howard Weiss
*Assistant Examiner* — Tifney Skyles
(74) *Attorney, Agent, or Firm* — Bryan Cave LLP

(57) ABSTRACT

High-power and high-frequency semiconductor devices require high signal integrity and high thermal conductance assembly technologies and packages. In particular, wide-gap-semiconductor devices on diamond benefit from spatially separate electrical and thermal connections. This application discloses assembly and package architectures that offer high signal integrity and high thermal conductance.

14 Claims, 24 Drawing Sheets

RF AND MILIMETER-WAVE HIGH-POWER SEMICONDUCTOR DEVICE

RELATED APPLICATIONS

This application claims priority to U.S. Provisional Patent Application Ser. No. 61/233,390 filed Aug. 12, 2009.

FIELD OF THE INVENTION

The present invention relates to packaging designs and assembly methods for high-power electronic and optoelectronic devices that offer improved thermal management and signal integrity at high frequencies. More specifically, the invention it discloses apparatus embodiments including flip-chip electrical interconnections and heat extraction package designs for gallium-nitride-based devices fabricated on diamond substrates or films. The disclosed embodiments are applicable to wide-gap semiconductor devices fabricated on highly-thermally conductive substrates in general with application in radio-frequency (RF) electronics and optoelectronics.

BACKGROUND

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic devices while maximizing performance (power and speed) and reliability. Examples of such devices are microwave transistors, light-emitting diodes and lasers.

In recent years, devices and circuits based on gallium nitride (GaN) and other wide-gap semiconductors have surfaced as new choices for power amplifiers, visible-light generating optoelectronics, and power electronics. Unfortunately, heat extraction is a problem since GaN has relatively low thermal conductivity (lower than silicon). Integrating GaN with synthetic diamond substrates is a technology that promises to enable high-efficiency heat extraction from GaN devices. However, heat extraction and microwave performance and device cost are generally difficult to satisfy at once.

This application discloses device structures and methods for realizing high-performance RF and mm-wave GaN field-effect transistors on diamond integrated with carrier substrates which are then used to form thermally efficient packages with high-performance electrical interconnects.

Flip-chip technology refers to semiconductor die mounting technology in which the die is mounted upside-down with its front surface (where the transistors are located) to a substrate using electrical contacts that are prepared on both the front surface of the die and the top surface of the substrate on which the die is to be attached. The advantages of flip-chip technology over wire-bonding (used in most chip interconnect technologies) in microwave and milimeterwave applications are many: die mounting and electrical contacts are generally accomplished simultaneously, they yield smoother assembly process and better signal integrity (direct soldered connections typically have less inductance than wire bonds). Eliminating wire-bonds has several advantages: gold is used for wirebonds, and the wire-bond inductance is not as well controlled as solder bumps in flip-chip technology. This is particularly important for commercial work at mm-wave frequencies.

There are three main building blocks for flip-chip technology: the bumps on the chip preparation, the substrate, and the method of joining the chip to the substrate. There have been numerous development in the industry to apply this technology to high frequency applications. The process in which flip-chips are attached to substrates is called die-bonding and is usually performed with automated equipment. In order to assure good alignment, often a two-camera vision system is used to index the pads on the chip to the substrate. Alignment is critical to RF interconnect performance, but the best equipment of today can routinely align chips to better than five micrometers. For more information see references [8] and [9] incorporated here as a reference.

The electrical and optical activity in many electronic and optoelectronic semiconductor devices occurs at the surface of the chip, namely, the active current flows laterally close to the surface of the chip and the device terminals are proximal to the same side of the chip. Examples of such surface devices are field-effect transistors, microwave switch diodes, and light-emitting devices such as super luminescent diodes, semiconductor lasers, and light-emitting diodes.

Flip-chip technology is based on providing contacts to one plane of the chip and is hence optimal for realizing good signal integrity. Most microwave chips are designed in microstrip fashion in which the top surface contains the active signals and the chip backside the return path. The back is conventionally used to as ground. The connections from the front to the back are accomplished using vias.

However, flip-chip technology has one main disadvantage: heat removal. The substrate is the heatsink and the heat has to be extracted through the metal bumps. For power circuits, such as, amplifiers this is a critical problem. The improvement of heat extraction in high-power field-effect transistors, specifically, GaN transistors is based on optimizing heat extraction through the solder bumps see references [5], [6], [7], which are incorporated here as a reference.

FIG. 1 (PRIOR ART) shows two arrangements for assembling and die-attaching a field-effect transistor known in the art. The field-effect transistor 100 comprising a substrate 101, semiconductor epilayers 102 containing the field-effect transistor channel 103, metal contacts to the source 104, gate 105, and the drain 106 disposed on top of the epilayers 102. The chip 100 is attached to a heatsink 110 at the chip bottom surface 109. The semiconductor epilayers 102 feature a conductive channel 103 whose carrier density is modulated using the voltage on the gate 105. In a high-electron mobility transistor, the conductive channel 103 is a two-dimensional electron gas realized at the heterojunction interface between two semiconductors. In normal operation (linear or switch-mode operation), most of the heat is generated in the areas between the source and the drain (area shown with 107) and then is spread and conducted through the substrate 101 to the heatsink 110 across the chip bottom surface 109. The heat spreading and conduction is illustratively shown using arrows 108. Heat removal by conduction of heat through the substrate 101 to the bottom side of chip 109 is the most efficient heat extraction scheme. This is especially true when a highly thermally-conductive substrate is used. The disadvantage of the mounting arrangement illustrated in FIG. 1(a) is that bond-wires (not shown) have to be used to connect the metal contacts 104, 105, and 106 on the top surface of the chip 100 to the external circuitry (not shown). At high frequency, these bond-wires degrade the performance of the chip due to their parasitic inductance.

An alternative assembly configuration uses flip-chip technology and is illustrated in FIG. 1(b). Here a field-effect transistor 150, comprising of a substrate 151, epilayers 152, metal contacts 155, is connected to the heatsink 160 using solder bumps 154 to metal traces on the substrate 160 (not shown) as is well known in the art. The heat generated in area 157 is then conducted to the heatsink 160 via any number of solder-bumps 154 as indicated with the arrows 158. Very little heat is typically taken out of the back-side 159, especially if the substrate is made out of a low conductivity material. The disadvantage of the setup shown in FIG. 1(b) is that many solder bumps are necessary to conduct the heat away and yet there are areas between the chip 150 and the heatsink 160 with under-fill or glob-top that help the flip-chip assembly and reliability, but do not add to the thermal conductivity. Solder bumps can be as small as 25 um in diameter and 30 to 100 µm in height. The advantage of using flip chip is in the signal integrity and the simplicity in volume assembly.

Heat extraction from flip-chip mounted devices is commonly done through the solder-bumps, but also taking the heat from the top (surface 159 in FIG. 1(b)). This is not common in high-power devices as it involves heat-conductive adhesives and pastes that generally have poor heat conductivity relative to metals and some semiconductors. Another reason why taking the heat out of the top of the chip (surface 159) is uncommon and difficult is managing the tolerance stack-up between the chip package and the chip thickness in the presence of thermal expansion and manufacturing variations.

It is clear that industry has a need for a device and package technology that simultaneously delivers high signal integrity and low thermal resistance.

SUMMARY OF THE INVENTION

This application discloses several methods and apparatuses for the realizing simplified assembly and mechanical design (and thereby lower chip cost), higher signal integrity, and highly-efficient thermal management for high-power and high-frequency field-effect transistors. The presented device structures and connection architectures are disclosed for use with gallium nitride and related materials which may be integrated with synthetic diamond as the substrate for improved heat spreading and heat conduction. The invention may be applied to a wide range of wide-gap semiconductor materials (defined below) and other substrate materials that exhibit high thermal conductivity without departing from the spirit of the invention.

Integrating wide-gap semiconductor materials with synthetic diamond substrates layers is important for improving the performance of microwave transistors and diodes, high-voltage and high-power electrical or microwave switching devices (transistors, diodes), light-emitting diodes, lasers, solar cells, and other electronic and optoelectronic devices.

For the purpose of this application, the terms "wide-gap semiconductor" and "wide-gap semiconductor technology" is widely used in the industry and it refers to semiconductor materials and semiconductor device and manufacturing technology based on wide-gap semiconductors. In this application, for clarity, "wide-gap semiconductor" means (a) semiconductors comprising a bond between nitrogen (N) and at least one Group III element from the Periodic Table of the Elements (boron, aluminum, gallium, indium, and thallium), (b) semiconductors comprising a bond between carbon (C) and at least one Group IV element from the Periodic Table of the Elements (carbon, silicon, germanium, tin, and lead), or (c) semiconductors comprising a bond between oxygen (O) and at least one Group II element from the Periodic Table of the Elements (eg. beryllium, magnesium, calcium, zinc, cadmium). Specifically, this application applies, but is not limited to, gallium nitride (GaN), aluminum nitride (AlN), indium nitride (InN), aluminum gallium nitride (AlGaN), indium gallium nitride (InGaN), aluminum indium nitride (AlInN), zinc oxide (ZnO), silicon carbide (SiC), and diamond (C). Any of the mentioned materials (a), (b), or (c) may be single-crystal, polycrystalline, or amorphous. Single-crystal means being of one crystal, or having a translational symmetry. This term is common for crystal growth, and is a requirement for most semiconductors. Polycrystalline means consisting of crystals variously oriented or composed of more than one crystal. Amorphous means a material having no real or apparent crystalline form. As is well known in the industry, single crystal wafers and substrates are made using bulk crystal growth techniques resulting in large so called boules, which are then cut to wafer shape. Electronic and optoelectronic devices manufactured out of single-crystal layers of different semiconductor properties are made by different single-crystal growth techniques. It well known in the industry that single-crystal layers for electronic and optoelectronic devices is performed in specially designed machines which enable precise growth of very thin single-crystal semiconductor layers on top of wafers or other thin semiconductor layers. The layers manufactured in such machines are commonly referred to as epitaxial layers and their thickness can vary anywhere from sub-nanometer to tens of micrometers. The machines that make them are referred to as epitaxial growth machines. Examples are Molecular Beam Epitaxy (MBE), Organo-Metallic Vapor-Phase Epitaxy (OMVPE also referred to as MOCVD), and Liquid Phase Epitaxy (LPE). It is also well known in the industry that single-crystal semiconductors are characterized by a lattice constant, while polycrystalline and amorphous materials are not.

For the purposes of this application, "gallium-nitride-related materials" means semiconductors comprising a bond between nitrogen (N) and at least one Group III element from the Periodic Table of the Elements: boron (B), aluminum (Al), gallium (Ga), indium (In), and thallium (Tl)). This also includes ternary alloys of the type $IIIa_xIIIb_{1-x}N$ or $IIIa_xIIIb_{1-y}IIIc_{1-x-y}N$ wherein IIIa, IIIb, and IIIc are any one of Group IIIA elements {boron, aluminum, gallium, indium, and thallium} and N is nitrogen. It also includes any combination in which $IIIA_xIIIB_{1-x}N_yX_{1-y}$ where X is another Group VA element.

For the purposes of this disclosure, a "planar network" or "graph" is a network that can be drawn in a plane without crossing any lines. A non-planar network or graph cannot be drawn on a plane without crossing lines—it will have at least one line crossing. A biplanar network or graph is a union of two planar networks that can be drawn on two planes without crossing any lines; the lines may transition from one plane to another arbitrary number of times. A path-connected geometric surface is a surface in which any two points belonging to the surface can be joined by a path. A surface that is not path-connected is referred to as path-separated surface.

A "terminal", "terminal electrical trace", or "device terminal" refer to structures or network nodes that are conventionally used to access a device or a network, for example, a multi-finger field-effect transistor has three terminals: gate, source, and drain, while a microwave switching diode has two terminals: the p and the n sides.

An "electrode" is an electrical structure or metalized trace or pad within a device that has a function on the device level, it may or may not be accessible from a device terminal. An electrode may also be a node in the network generally inaccessible to the outside world. For example, a two-bipolar-transistor circuit configuration called the Darlington pair, well-known in the industry, has the emitter of one of the transistors electrically connected to the base of the other transistor in the pair. The metal trace that connects to the mentioned emitter and the mentioned base would be referred to an electrode. In the case of a multi-finger field-effect transistor, the multiple gates fingers are referred to as gate electrodes. These gate electrodes may in some embodiments be electrically coupled to a gate terminal.

The "stiffness" of a body is a measure of the resistance offered by an elastic body to deformation (bending, stretching or compression). The inverse of stiffness is compliance. Stiffness is a property of a solid body dependent on the material and the shape and boundary conditions. For the special case of unconstrained uniaxial tension or compression, Young's modulus can be thought of as a measure of the stiffness of a material.

The gallium nitride material system gives rise to microwave transistors with high-electron mobility (necessary for high-speed operation), high breakdown voltage (necessary for high power), and thermal conductivity that is greater than GaAs, InP, or silicon, and thus suitable for use in high power applications. GaN is also manufactured at temperatures closer to those used in silicon processing (~1000° C.). Recently, growth of GaN on silicon has been demonstrated and investigated.

Because GaN devices offer high current density and high voltage operation, they exhibit larger total power losses due to parasitic resistances and the inefficiency inherent to the amplification process. Most of heat dissipation occurs along the channel and underneath the contacts (namely close to the top surface of the chip). Efficient removal of this heat is essential to making practical GaN field-effect transistors. However, prior art GaN devices have used substrates that have drawbacks negatively impacting device microwave and/or thermal performance or price. Examples of such substrates are silicon, sapphire and silicon carbide.

In all of these applications, heat removal is typically accomplished by placing the electronic device, optical device or integrated circuit as close as possible to a heat sink. A heat sink is a substance or device for the absorption or dissipation of unwanted heat (as from a process or an electronic device). Most often, the heat sinks are copper blocks attached to a water-cooling system, aluminum fins, or a micro-channel cooler. Diamond heat sinks are being actively investigated because of the superior thermal properties of diamond. However, because of the material and process temperature incompatibility, only bonding or die attach methods have been investigated. Conventional heat removal systems for transistors and light-emitting devices (based on bonding and attaching devices to heat sinks) are typically large in comparison with the heat source in the electronic chip or individual device and offer limited thermal performance improvement.

Natural diamond is an excellent thermal conductor, but historically has not been available for these applications due to scarcity and price. The present invention includes the use of synthetic diamond deposited by chemical-vapor deposition (CVD). This material has thermal conductivity similar to that of single crystal diamond. In the CVD process a substrate on top of which synthetic diamond is to be deposited is placed in a vacuum chamber, where methane and hydrogen are introduced and activated using either microwave plasma or tungsten filaments. The typical wafer temperatures are around 800° C. during the deposition process and the deposition rates are measured in micrometers (μm) per hour.

For at least some implementations of the present invention, the growth of synthetic diamond includes a nucleation phase in which conditions are adjusted to enhance the nucleation of diamond on the host substrate. This may be done by scratching the surface with diamond powder or by forming a nucleating layer on top of the surface. Nucleation layer means, in material deposition or crystal growth, a layer that helps start the growth or formation of another layer of material or stochiometry. In one embodiment, the nucleating layer materials is made out of amorphous silicon nitride. In another embodiment, the nucleating layer is made out of amorphous silicon carbide. Other amorphous or polycrystalline materials known to aid in the nucleation of synthetic diamond may be used without the departing from the scope of the present invention. Examples are silicon and other wide-gap semiconductor materials. In one embodiment, the nucleating layer is at most 150 nm thick. In another embodiment, the nucleating layer is at most 50 nm thick.

Rather than depositing the nucleation layer in a separate process step, the surface may be prepared for synthetic diamond nucleation by ending the growth of a wide-gap semiconductor layered structure with a layer specifically formed to nucleate synthetic diamond. The choice of materials is a wide-gap semiconductor, such as, aluminum nitrate or silicon carbide, that may be crystalline or polycrystalline. In this latter embodiment, no additional deposition of a nucleating layer is necessary as the surface on which synthetic diamond is to be grown has then been prepared for nucleation. An improper choice of nucleating film may result in highly stressed films. Additionally, during the growth phase, the grain size of synthetic diamond increases and as a result synthetic diamond films are inherently rough after deposition.

Another aspect of the present invention is that the processes disclosed herein solves several of the key problems which have prevented use of synthetic diamond in the past: (a) diamond deposition is a high process temperature (approximately 800° C.) that is incompatible with most compound semiconductor processes used in high-frequency and optical applications (gallium arsenide and indium phosphide decompose at approximately 600° C.); (b) for the same reason, synthetic diamond deposition is also incompatible with most metals used in semiconductor industry; and (c) synthetic diamond is polycrystalline and hence not compatible with any of the single-crystal growing techniques for growing compound semiconductors. For these reasons, integration of diamond heat sinks with devices and circuits has been done exclusively by bonding or die attachment methods. The present invention provides the first structures and methods for successfully fabricating gallium nitride layers with diamond heat sinks. Bonding means to cause to adhere firmly; to hold together in a molecule or crystal by chemical bonds; to hold together or solidify by or as if by means of a bond or binder. This process is commonly used in the semiconductor technology.

The maximum handling power of a field-effect transistor 100 is determined by the maximum current carrying capacity (IDSS) of the channel 103 and the breakdown voltage (VBDS). Typical values for power handling capability of GaN-based HEMTs are in the range of several W/mm of gate periphery (or gate width). In order to increase the power handling capability of a single device, the gate periphery as to be increased. The increase in gate periphery is accomplished by increasing the width or periphery the associated source and drain electrodes adjacent to the gate. However, due to the resistance of the metallization used to make the gate, the gate to source capacitance, and resulting phase delay, the operating frequency places a practical maximum on the gate width. For this reason, high-power transistors operating at RF employ multiple gates (or gate fingers) in which the width of each gate is equal and adjusted to maximum value acceptable by the high-frequency performance requirements of the over transistor. FIG. 2 shows schematically two exemplary field-effect transistors: one with two gate fingers (200) and one with four gate fingers (250). For example, in gallium-nitride-based HEMTs operating at 10 GHz, the typical longest individual gate width is in the neighborhood of 100 um, whereas the number of gate fingers can vary from 2 to more than 10, depending on the desired power output. A simple calculation of the power handling capability of a field-effect transistor with multiple gates is given by the number of fingers (N) multiplied by the individual gate width (W) times the specific power handling capability (P [W/mm]): $P_{TOT} \approx N \cdot W \cdot P$ [W].

High-frequency transistors are generally intended to be connected in a coplanar mode with two ground conductors surrounding a central signal conductor. This is illustrated in FIG. 2 (Prior Art) where both field-effect transistors 200 and 250 are each shown with a single gate terminal (204 and 254), a single drain terminal (203 and 253), and two source terminals (202 and 252). In as much as coplanar contacts are possible, most often in the industry, the back of the chip is metal coated and used to provide ground (and die attach). For this reason, field-effect transistors will also have vias leading the electrical path from the front of the chip to the backside contact. The location of these vias is schematically illustrated in FIG. 2 with 209 and 259.

Multiple gate fingers allow the sources and drains to share metal pads as is shown in FIG. 2, thereby reducing the number of metal pads. Furthermore, using more than two gate fingers requires the use of bridges or individual source vias. This is because the connection between the sources, drains, and gate regions of a field-effect transistor with more than two gate fingers to the field-effect transistor source, drain, and gate terminals cannot be done using a planar network. This is illustrated schematically in FIG. 2(b) where a transistor with two gate fingers (left) can be connected using a planar metallization (no need for bridges), while a transistor with four gate fingers leaves the central source pad floating unless bridges are introduced to connect it to the end sources and the ground. Namely, it requires at a bi-planar network of electrical traces to complete the connection. Stated differently the metallization required to access all the gates, drains, and sources, and connect them to the transistor terminals (S, G, D) does not form a planar network (or graph). The equivalent circuits of the two transistors shown in FIG. 2 are shown in FIG. 3 and shows how the bridge metallization 353 enables connection of the central source region.

One approach to realizing field-effect transistor connections is using bridge metallization, as shown in FIG. 2(b). The resulting bridges may be supported by polyimide or free-standing in air, commonly referred to as air-bridges. Bridges (especially air-bridges) have at least two disadvantages: First, they make the surface of the chip susceptible to damage and care must be employed when picking and placing such die. Second they introduce excess inductance in the source line of the partial transistors closer to the center of the device since the current has to pass from the edge to the center to reach the central source. Introducing inductance into the source of a transistor results in negative feedback in the transistor circuit and will reduce gain in a power amplifier at high frequency.

An improved approach employed in the industry that alleviates the difficulties associated with bridges is the use of individual-source vias. Most integrated circuits are built to have a metalized back surface (as shown in FIG. 1 with 109). This surface is conventionally (and practically) always at the ground potential (or AC ground potential). In field-effect transistors such as shown in FIG. 2 and FIG. 3, the back connector is invariably connected to the source and hence vias, metalized channels formed in the chip substrate, are made to connect the source metallization on the top surface of the chip to the back surface. The vias establish an electrical contact between the top and the bottom of the chip and are used for grounding and providing return path for microstrip traces in millimeter and microwave circuits on such chips. Source metallization can be connected to the back-side of the substrate in two ways: using end-source vias (shown in FIG. 2) and individual-source vias (shown in FIG. 4).

FIG. 4 shows the metallization on a field-effect transistor with four gate fingers, similar to the one in FIG. 2(b) and vias that protrude from the surface of the chip to the back 410 providing ground electrical connection to the sources. Additional vias 407 can always be added. The advantages of individual source connection are well known in the industry: They reduce the source inductance and reduce the electrical delay from the source terminal on the transistor chip and the individual sources. The industry references for this technology show it successfully applied to GaAs-based chips where etching technology is well developed and small vias (tens of micrometers) can be manufactured. See references [1], [2], [3], [4].

However, the difficulty with implementing individual source vias is their size. Vias diameters and the alignment tolerances range from several tens of micrometers to hundred micrometers which is comparable to the desired individual source width. Hence this places strict requirements/restrictions on the alignment, etching profile, and damage around the mouth of the via. Furthermore, coating of the interior of the via is easier and more complete when the width/depth aspect ratio is higher—typically preferred to be greater than ½. These difficulties are made even more severe when one attempts to incorporate individual source vias in high-power and high-frequency devices made out of hard materials, such as, silicon carbide and synthetic diamond: Etching in these materials is slow (increasing the cost) and it is difficult to realize very high etching selectivity and aspect ratio. This is especially true in synthetic diamond. Synthetic diamond is more efficiently micro-machined using laser drilling which unfortunately tends to leave some damage around the via mouth. This in turn further increases the effective via diameter and hence the requirement for a wide source electrode. Increasing the gate clearance increases the size of the transistors—undesirable result when the size of the increases the cost of the chip. All of these difficulties reduce the yield and increase the cost.

Another important disadvantage of using individual source vias with materials such as silicon carbide and synthetic diamond is the loss of thermal conductivity in the substrate: The interior of the vias is either metal coated, but the via remains either air-filled or filled with solder both of which have a substantially lower thermal conductivity than the substrate material around them. Silicon carbide has somewhat, while diamond has substantially higher thermal conductivity than typical solder hence the presence of the vias in the substrate is detrimental to the thermal management of the device.

In preferred embodiments, a high-power gallium-nitride-on-diamond field-effect transistor chip has planar metallization on the transistor-side of the chip (with no bridges and no vias) such that the gate, drain, and all individual source metalized electrodes (traces) are individually is connected to secondary metallization trace on the secondary substrate using flip-chip technology. The secondary metallization on the source substrate includes at least one source, gate, and drain terminal, respectively. This results in a planar electrical-trace networks on both the gallium-nitride-on-diamond chip and the secondary substrate significantly simplifying the manufacturing process. The solder bumps are placed on the chip only in the places where they improve and support high signal integrity. The two planar networks on the chip and the substrate, when connected via the solder bumps form a bi-planar network.

In another embodiment, solder-bumps connecting the individual source electrodes on the chip to the source metallization trace on the secondary substrate are arranged to form a linear array perpendicular to the direction of the gate fingers thereby facilitating a uniform electrical delay from the source terminal on the secondary substrate to the individual sources on the chip.

In yet another embodiment, a field-effect transistor with multiple gate fingers arranged in a linear array, the number of solder-bumps on source electrodes at the ends of the linear array is half the number of solder-bumps appearing on all other individual sources. This ensures equal resistance and inductance on each source.

In another embodiment, a high-power gallium-nitride-on-diamond field-effect transistor chip is coupled to a secondary substrate using flip-chip technology with the transistor active layers proximal to the secondary substrate and the diamond-substrate back-side distal from the secondary substrate and attached to a heat-conductive package block, wherein in the tolerance stack-up between the back-side of the diamond-substrate and the heat-conductive package block is accommodated with a gasket selected from a selection of predetermined discrete gasket thicknesses. In another embodiment, the tolerance stack-up between the back-side of the diamond-substrate and the heat-conductive package block is accommodated using flexible secondary substrate. In yet another embodiment, the force on the chip is determined using pressure exerted by the package lid whose distance to the secondary substrate is adjusted using a gasket selected from a selection of predetermined discrete gasket thicknesses.

In another embodiment, a high-power amplifier package is disclosed using substrate-down cooling approach and wire-bonded electrical connections.

One of the advantages of this invention is that both the metallization on the transistor chip surface and on the top surface of the secondary substrate remain planar. This feature enables simple processing of the chip and the secondary substrate. And lowers the cost.

Another advantage of the this invention is that the electrical connection between the secondary substrate and transistor chip is realized using flip-chip technology and has no wire-bonding, no vias, and no (air) bridges thereby resulting in improved signal integrity (due to lower parasitic inductances and capacitances associated with vias and/or bondwires).

Another advantage of this invention is that heat is extracted directly and optimally from the side of the chip that has highest thermal conductivity, un-obstructed by any electrical connections and any other low-thermal conductivity features.

One electrode on a surface of a chip means a metal trace that is continuous and connected. More than one electrode can be used to connect a single region in the semiconductor, and vice versa more than one region may be connected using a single electrode. Two electrodes mean two metal traces that represent two unconnected areas, They may or may not be electrically coupled through the semiconductor, but in the absence of the semiconductor or another metallization that may come on top, they are not electrically coupled.

A source electrode is a metallization that is adjacent to the source region of a FET and is electrically coupled to the source region.

IN THE DRAWINGS

FIG. 1(a) (Prior Art) illustrates a conventional substrate-down field-effect transistor chip attachment to a heat sink.

FIG. 1(b) (Prior Art) illustrates a conventional flip-chip attachment of a field-effect transistor chip.

FIG. 2(a) (Prior Art) shows high-frequency field-effect transistor with two gate fingers, and exemplary location of end-source vias.

FIG. 2(b) (Prior Art) shows high-frequency field-effect transistor with four finger and air-bridges and exemplary location of end-source vias.

FIG. 3(a) (Prior Art) shows equivalent circuit schematic for the transistor shown in FIG. 2(a).

FIG. 3(b) (Prior Art) shows equivalent schematic for the transistor shown in FIG. 2(b).

DETAILED DESCRIPTION

A discrete field-effect transistor has three terminals: source, gate, and drain terminals. To produce higher power, field-effect transistor are built in parallel so they utilize multiple gates and share multiple drains and sources. The maximum handling power of a field-effect transistor is determined by the maximum current carrying capacity (IDSS) of the channel with the 2D electron gas and the breakdown voltage (VBDS). As the current-carrying capacity (and hence power handling) capacity limited by material and epilayer structure properties, the power handling capacity is largely controlled by increasing the gate periphery (and the width or periphery the associated source and drain periphery that is adjacent to the gate). Due to the resistance of the metallization used to make the gate and resulting phase delay along the gate finger, the gate finger length cannot be increased indefinitely without producing a severe impact on the maximum operating frequency of the transistor. For this reason, high-power transistors operating at RF employ multiple gates (i.e. multiple gate fingers) in which the width of each gate is equal and adjusted to maximum value acceptable by the performance requirements of the over transistor.

Multiple-gate transistors with more than two gates require non-planar metallization traces to access all the gates, drains, and sources and connect them to the gate, source, and drain terminals on the chip as illustrated with Figures B and C and described in the accompanying text.

Figure 1A:
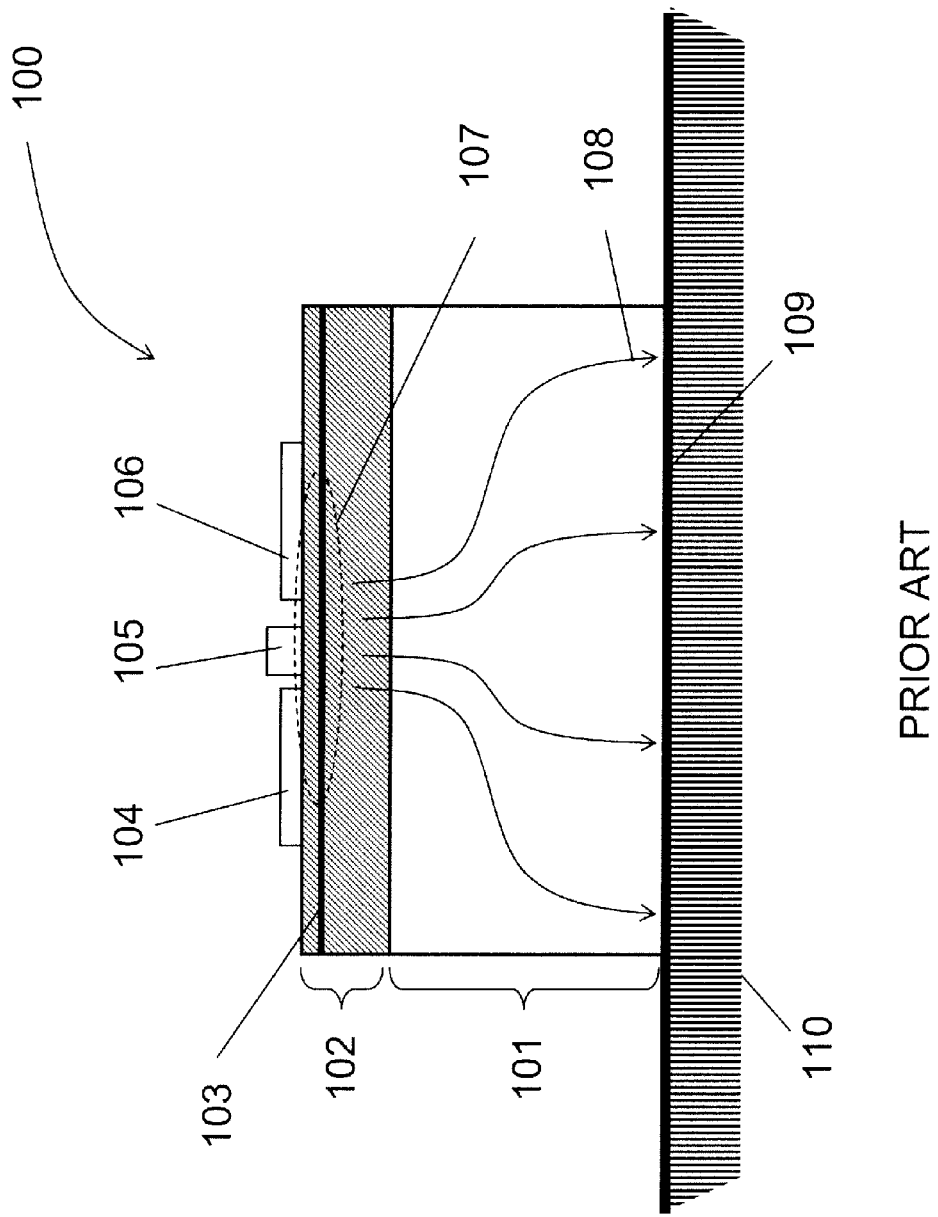
Figure 1B:
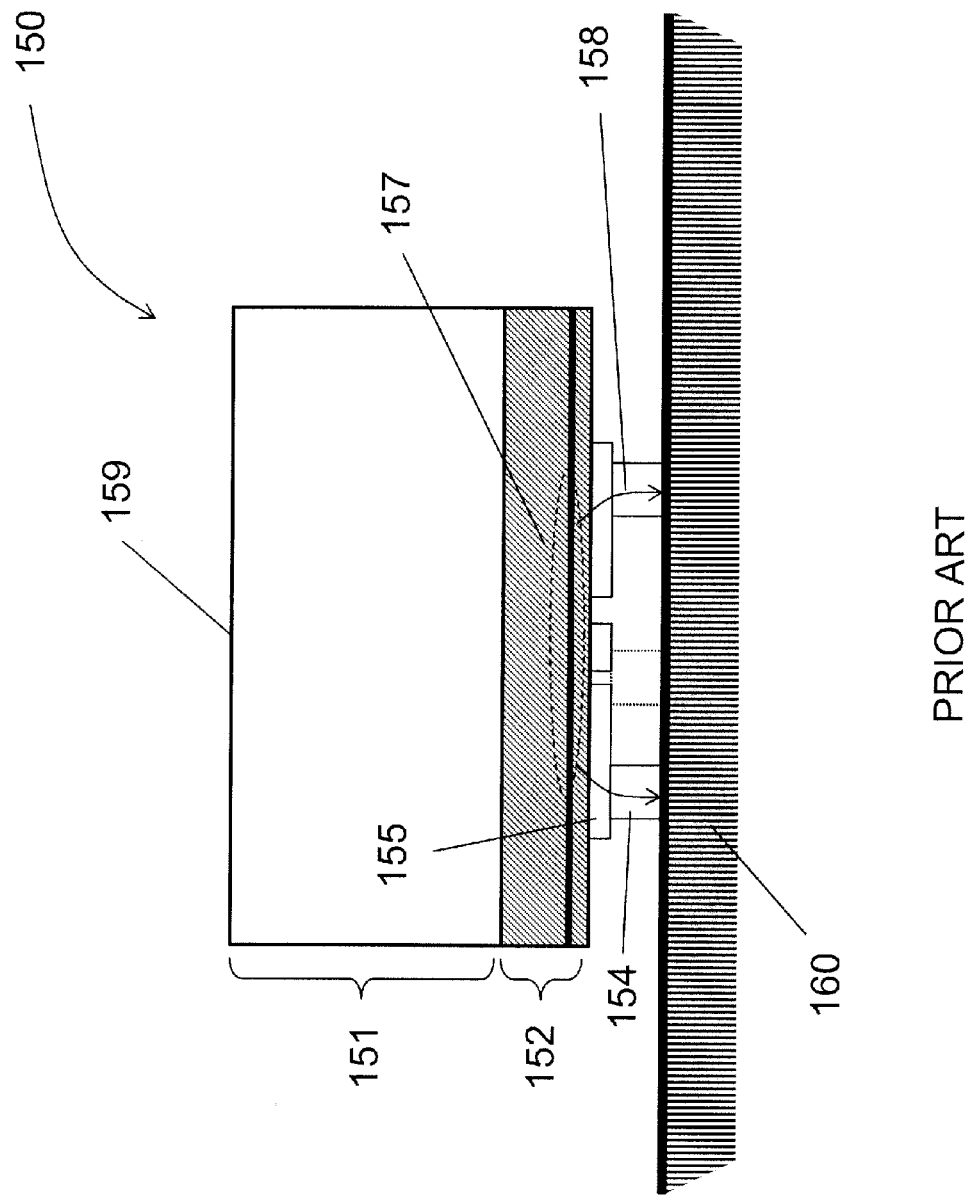
Figure 2:
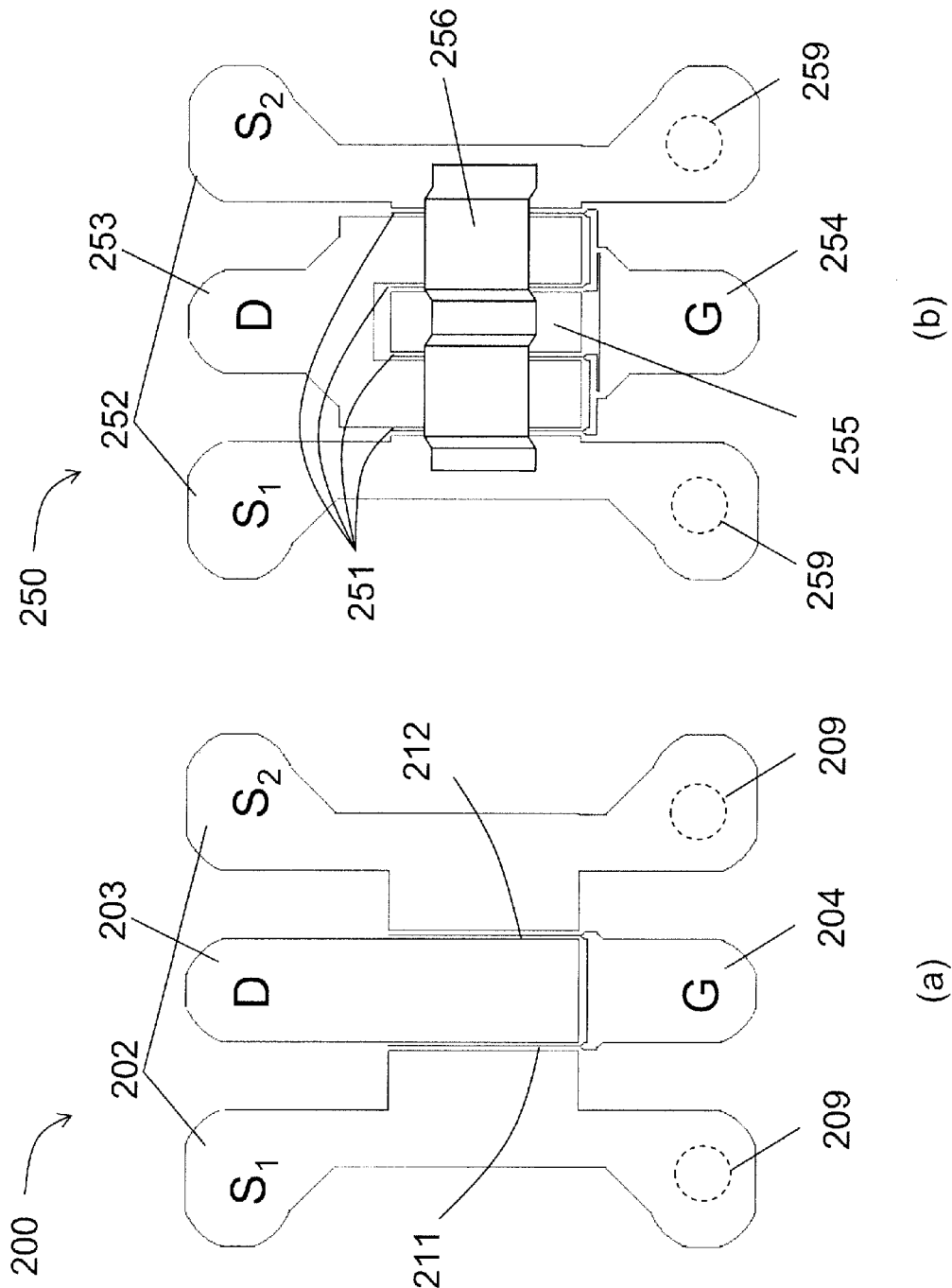
Figure 3:
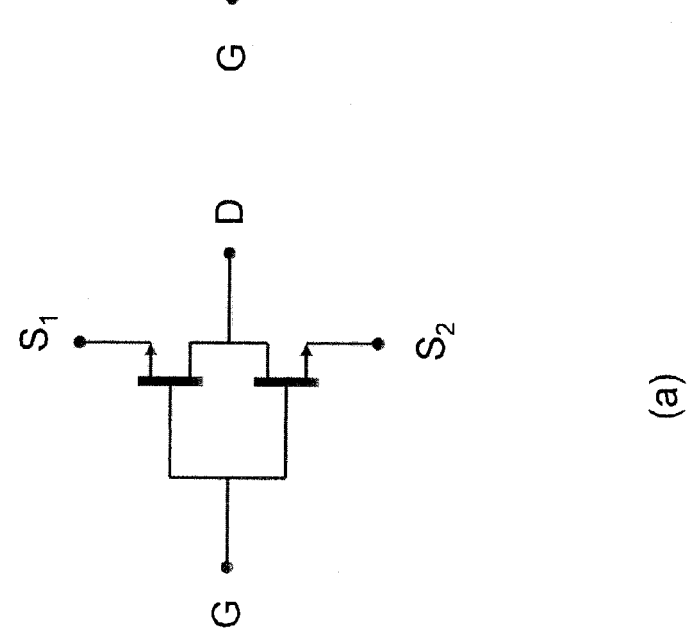
Figure 3:
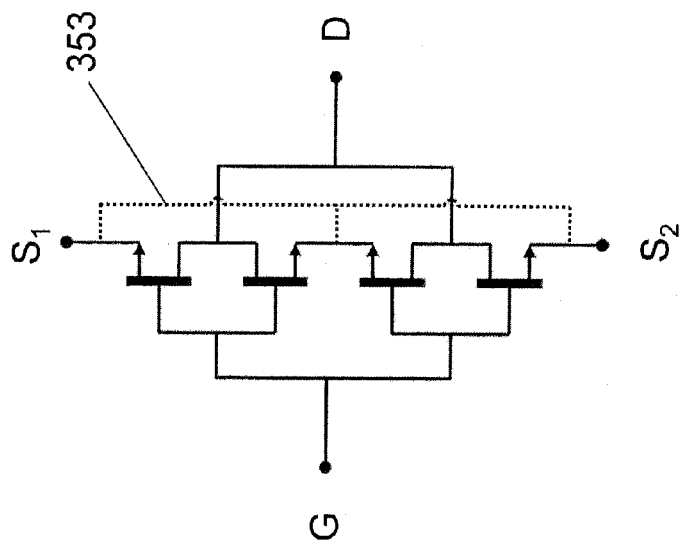
Figure 4:
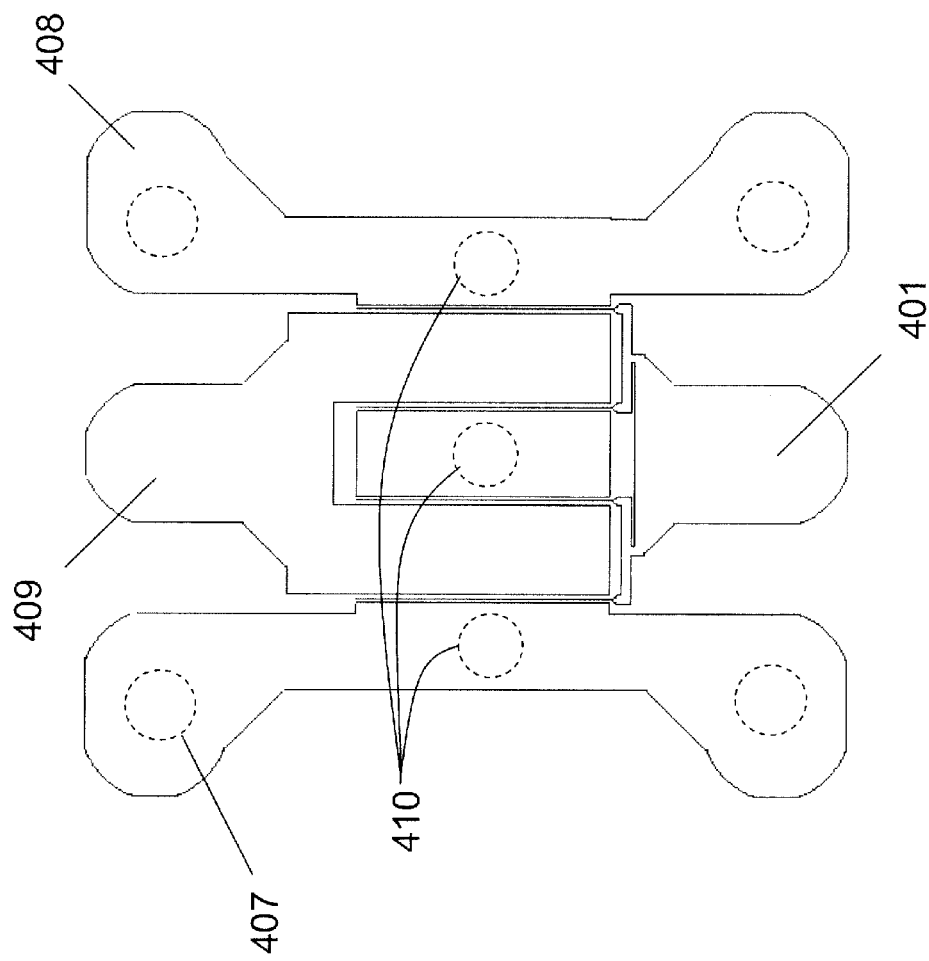
FIG. 4 (Prior Art) is an illustration of a high-frequency field-effect transistor with four gate fingers and individual source vias.
Figure 5A:
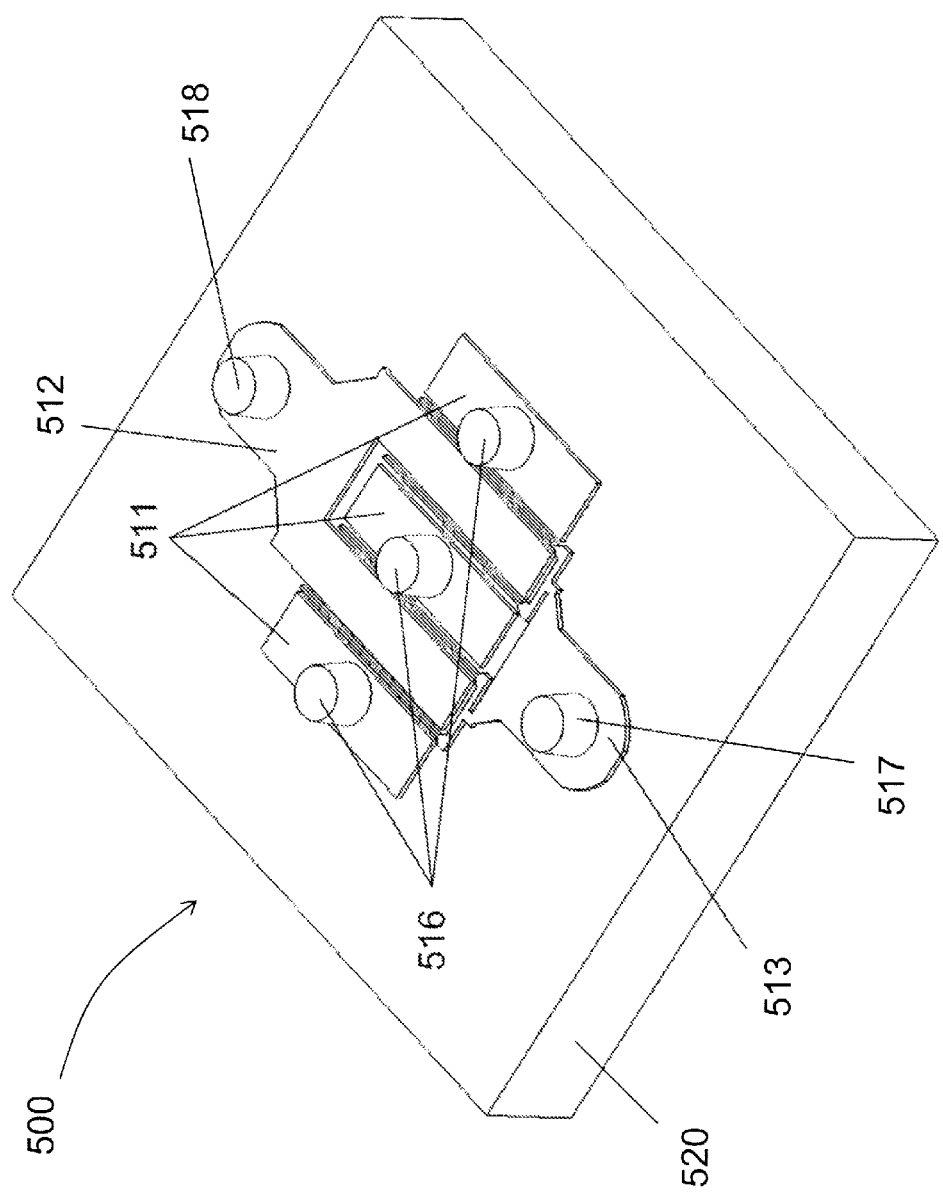
FIG. 5(a) is a perspective-view of an exemplary field-effect transistor chip with four gate fingers according to one preferred embodiment of the present invention.
Figure 5B:
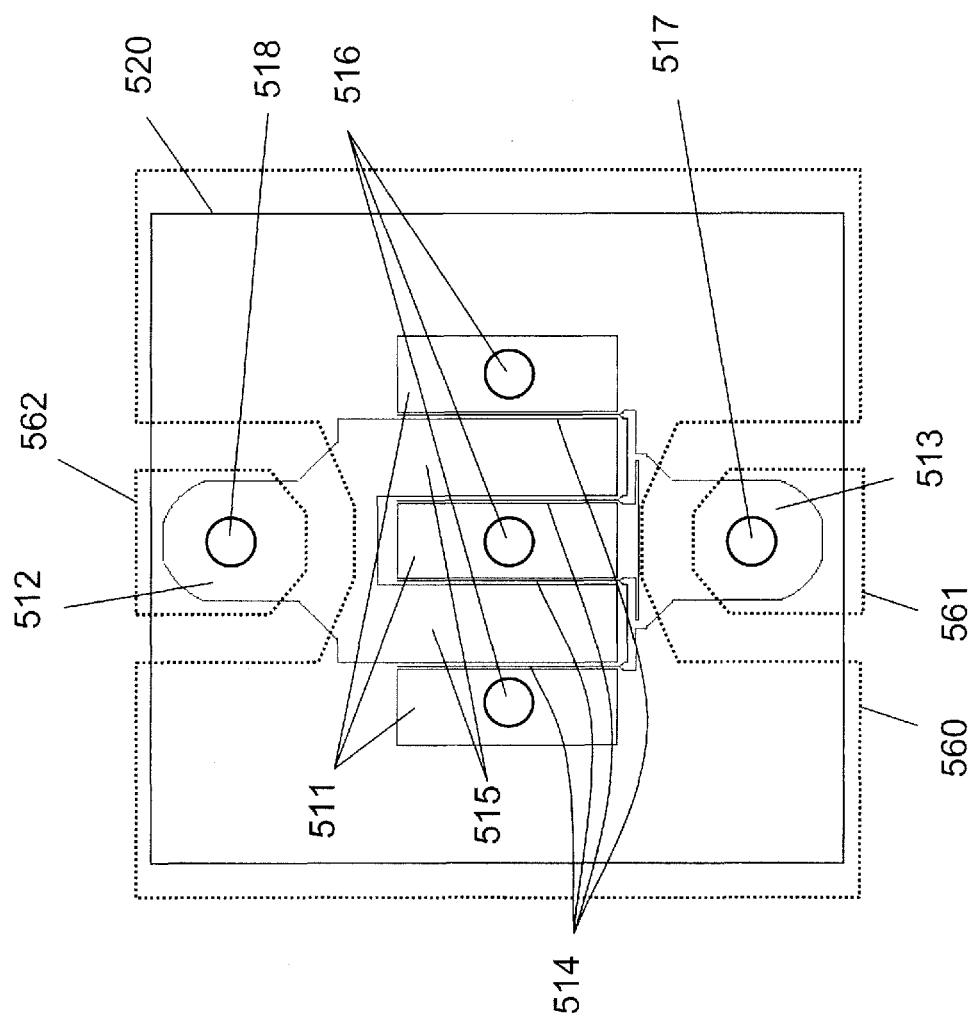
FIG. 5(b) shows a top view of the exemplary field-effect transistor shown in (a) with the metallization traces on the secondary substrate shown superimposed.

FIG. 5 is an illustration of a field-effect transistor chip according to the present invention. The field-effect transistor ship 500 comprises of a substrate 520, top-surface metallization traces that include gate metallization 513, drain metallization 512, and separate source electrodes 511, and at least one solder bump 517, 518, 516, for each of if the gate terminal 513, drain terminal 512, and each of the individual source electrodes 511, respectively. The metallization traces on the field-effect transistor chip 500 preferably form a planar network (graph) of electrical traces and electrodes.

Figure 6A:
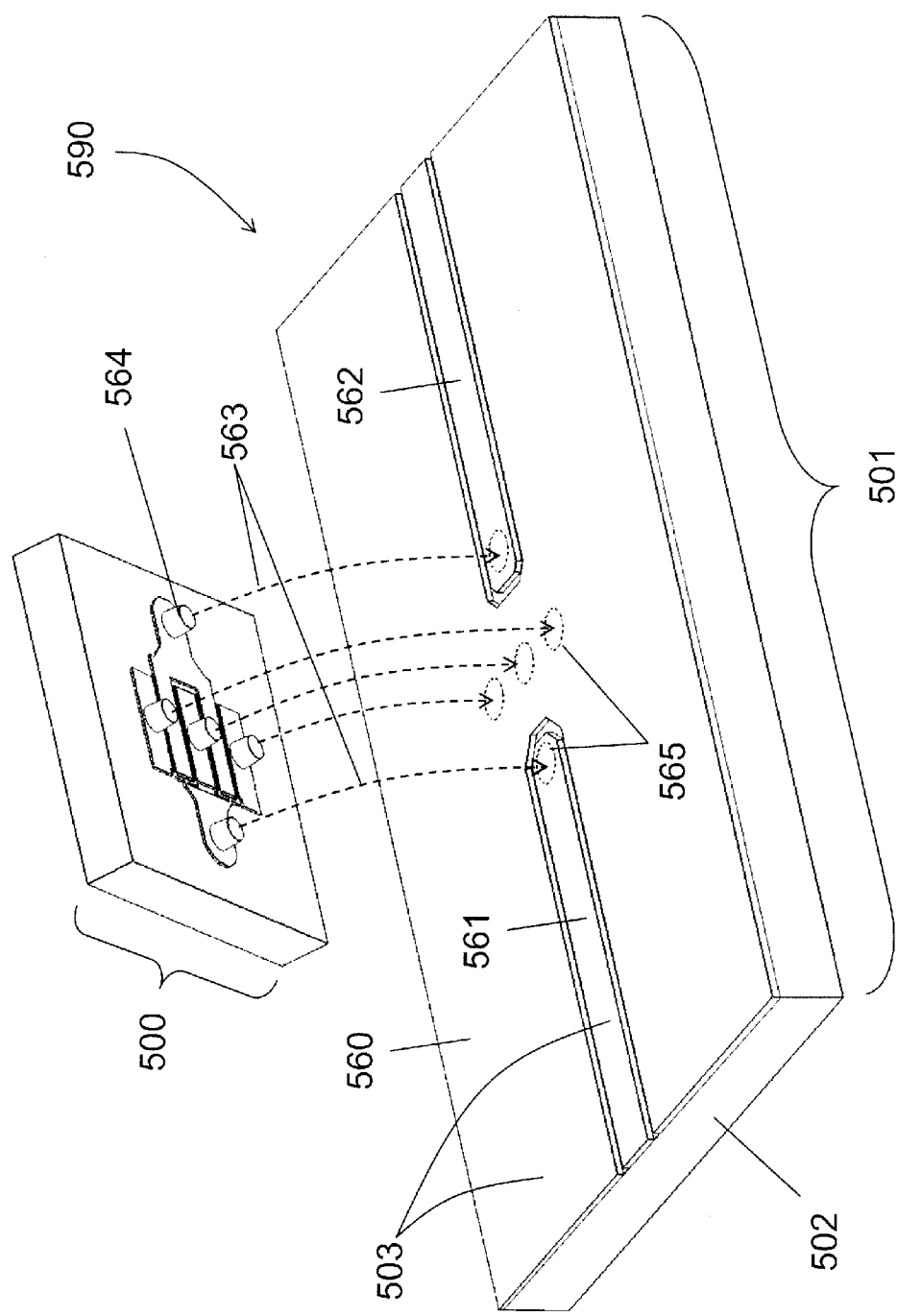
FIG. 6(a) illustrates an embodiment of the method of assembly of the field-effect transistor from FIG. 5 onto an exemplary secondary substrate by way of flip-chip bonding.

FIG. 6(a) illustrates one preferred embodiment of assembling a high-power transistor sub-assembly 590 in which a field-effect transistor chip 500 (also shown in FIG. 5(a)) is mounted upside down using flip-chip technology to a secondary substrate 501. The upside-down mounting action is illustrated with the dashed arrows 563. The secondary substrate 501 comprises of carrier 502 made out of insulating material and a metalized (conductive) coating 503 on top of the carrier 502. The metal coating has been patterned to accept flip-chip mounted transistor chip 500. The pattern comprises at least a ground plane 560, a gate-terminal trace 561, and a drain-terminal trace 562. The solder bumps 564 on the transistor chip 500 are attached to the metalized coating 503 on the secondary substrate 501 in the corresponding locations indicated with dashed circles 565. Solder bumps 564 in FIG. 6(a) include the solder bumps 516, 517, and 518 shown in Figures E(a) and E(b).

In one embodiment in the preferred invention, the gate metallization 513 on the transistor chip 500 is electrically coupled to the gate terminal trace 561 on the secondary substrate 501 via the solder bump 517, the drain metallization 512 on the transistor chip 500 is electrically coupled to the drain terminal 561 on the secondary substrate 501 via the solder bump 518, and each of the individual source electrodes 511 on the transistor chip 500 are electrically coupled to the ground plane 560 on the secondary substrate 501 and hence the ground plane 560 (also referred to as the source terminal) on the secondary substrate 501 establishes simultaneous connection to all of the source electrodes 511 on the transistor chip 500.

FIG. 5(h) provides details on transistor sub-assembly disclosed in Figures E(a) and J(a). The planar network of electrical traces and electrodes on the surface of the transistor 500 comprises of the drain terminal 512 and drain electrodes 515, the gate terminal 513 and the gate fingers 514, and the individual source electrodes 511. In one embodiment the drain electrodes 515 are electrically coupled to the drain terminal 512, the gate electrodes 514 (i.e. gate fingers) are electrically coupled to the gate terminal 513, while the source electrodes 511 are not coupled to any terminals on the chip; the source electrodes 511 remain disconnected. The transistor subs-assembly furthermore comprises a secondary substrate 501 with electrical traces operatively configured to connect to the electrical traces on the transistor 500 in such a way that the at least one solder bump 518 electrically couples the drain terminal 512 to the drain electrical trace 562 on the secondary substrate 501, at least one solder bump 517 electrically couples the gate terminal 513 to the gate terminal trace 561 on the secondary substrate 501, and at least one solder bump 516 on each of the individual source electrodes 511 that electrically couples the source electrodes 511 to the ground plane 560.

In another embodiment, the all the solder bumps 516 coupled to the individual source electrodes 511 form a linear array, the direction of the linear array being perpendicular to the direction of the gate fingers thereby ensuring more even electrical delay from the gate and the drain terminals.

Figure 5C:
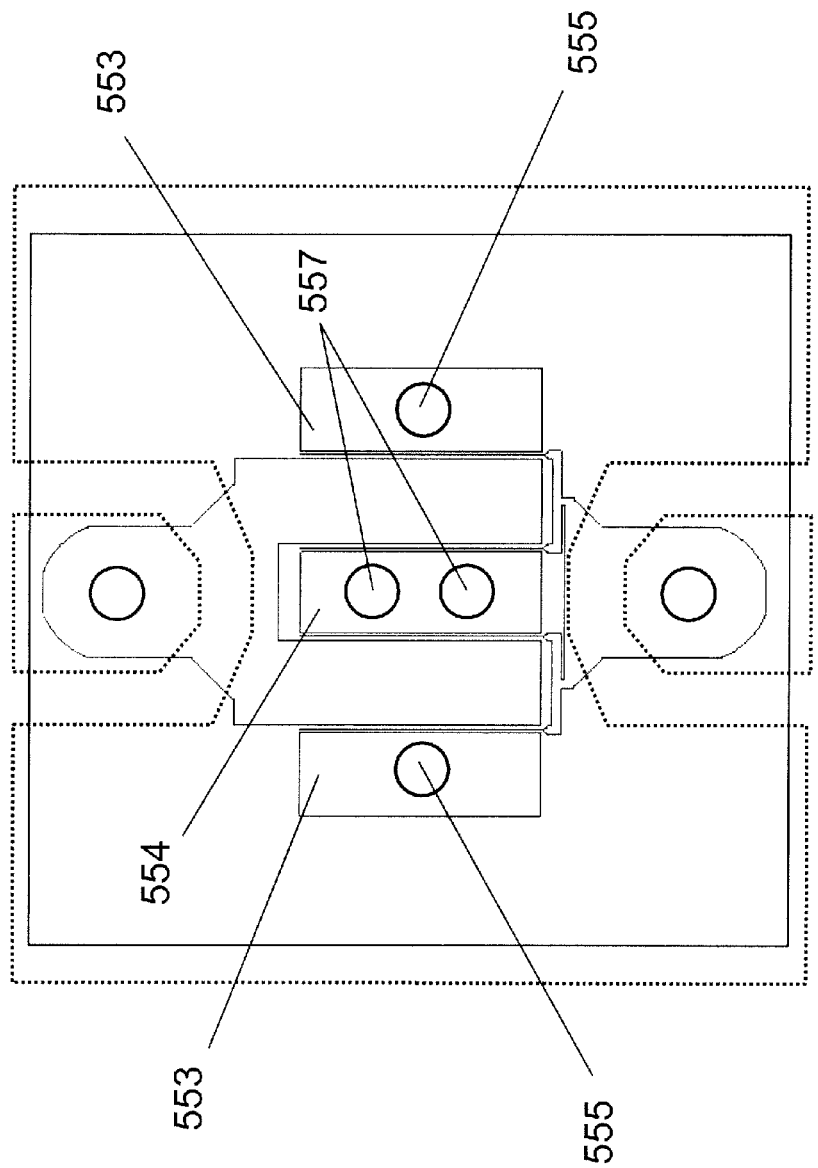
FIG. 5(c) shows a top view of an exemplary field-effect transistor with the metallization traces on the secondary substrate shown superimposed.

In another embodiment, illustrated in FIG. 5(c), there are half as many solder humps 555 on the source electrodes 553 at the end of the linear array of source electrodes as there are solder bumps 557 on the source electrodes in the between 554. The reason is that source electrodes 553 at the ends of the linear array of source electrodes carry half the current than the electrodes 554 between because they serve only one gate finger rather than two.

In another embodiment, the transistor chip 500 includes path-connected source and path-connected drain electrodes, but path-separated gate electrodes and the individual gate electrodes are coupled together to the gate terminal on the secondary substrate using flip-chip bonding. In yet another embodiment, the transistor chip 500 includes path-connected source and path-connected gate electrodes, but path-separated drain electrodes and the individual drain electrodes are coupled together to the drain terminal on the secondary substrate using flip-chip bonding.

In one embodiment, a semiconductor device sub-assembly comprises of a semiconductor-device chip having a first planar network of electrical traces with at least one path-disconnected electrical trace, and a secondary substrate having a second planar network of electrical traces, solder bumps electrically coupling the first planar network of electrical traces to the second planar network of electrical traces, wherein at least one solder bump electrically couples the at least one path connected electrical trace to the second planar network of electrical traces. In yet another embodiment, the resulting network of electrical traces and electrodes forms a connected bi-planar graph (i.e., the network has no path-disconnected electrodes).

Figure 6B:
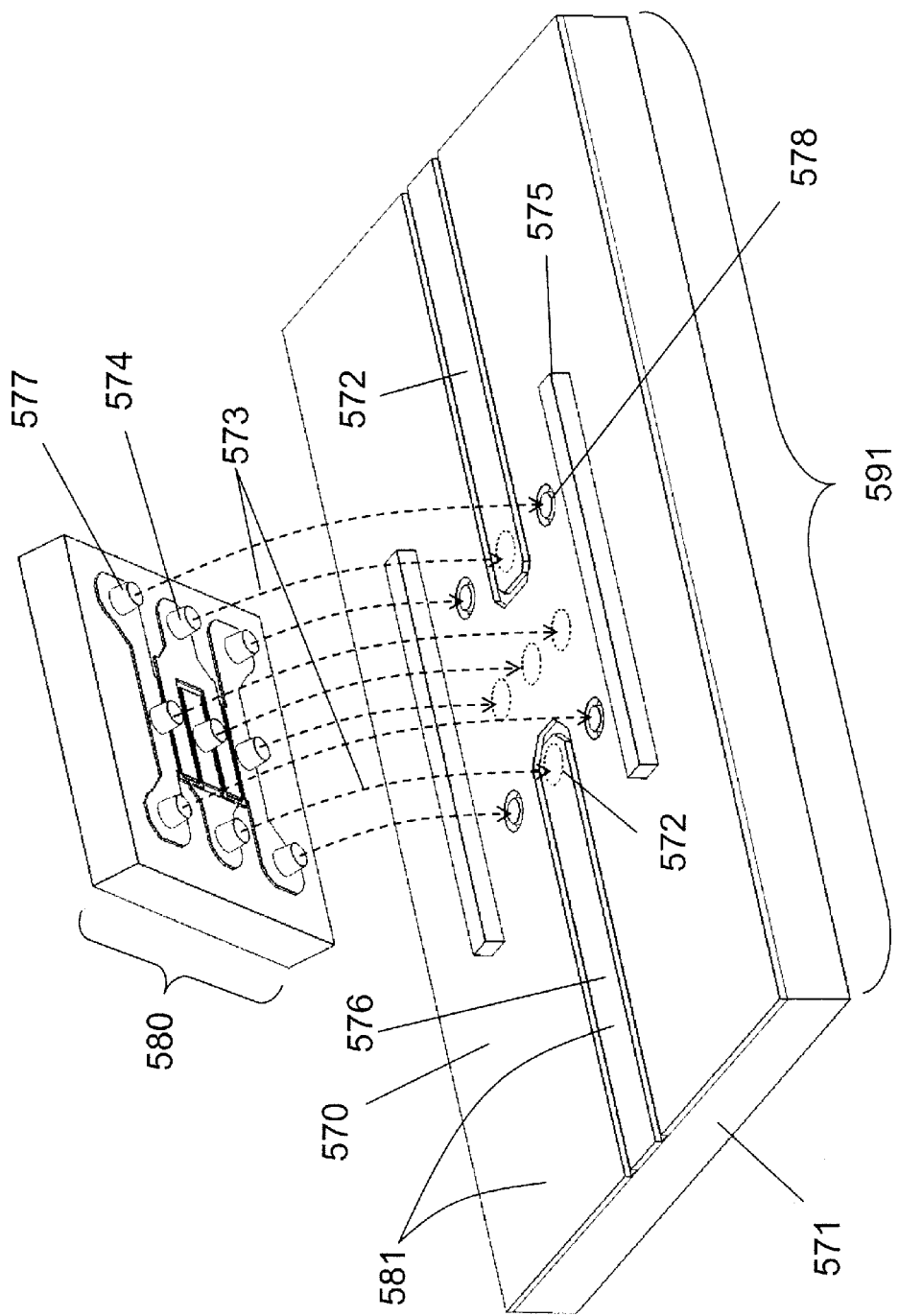
FIG. 6(b) illustrates another embodiment of the method of assembly of transistor from FIG. 5 onto an exemplary secondary substrate by using flip-chip bonding.

FIG. 6(b) illustrates another embodiment of assembling a high-power transistor sub-assembly in which a field-effect transistor chip 580 is mounted upside down using flip-chip technology to a secondary substrate 591. The upside-down mounting action is illustrated with the dashed arrows 573. The secondary substrate 591 comprises of carrier 571 made out of insulating material and a metalized (conductive) coating 581 on top of the carrier 571. The metal coating has been patterned to accept flip-chip mounted transistor chip 580. The pattern comprises at least a ground plane 570, a gate-terminal trace 576, and a drain-terminal trace 572. The solder bumps 574 on the transistor chip 580 are attached to the metalized coating 581 on the secondary substrate 591 in the corresponding locations indicated with a multiplicity of dashed circles 572. Solder bumps 577 (four solder bumps on the corners of the chip 580) attach to the alignment features 578 on the secondary substrate 591. In one embodiment the alignment features are not grounded nor connected to any other terminal on the secondary substrate (as shown in FIG. 6(b)). In another embodiment, upon flip-chip attachment, the solder bumps 577 remain grounded or connected to the ground plane.

In yet another embodiment, the transistor sub-assembly shown in FIG. 6(b) employs as suitable standoff features 575 that ensure that the transistor die 580 remains attached at a specified distance from the secondary substrate 591. The distance between the transistor die and the secondary substrate is preferably less than 100 um.

Figure 6C:
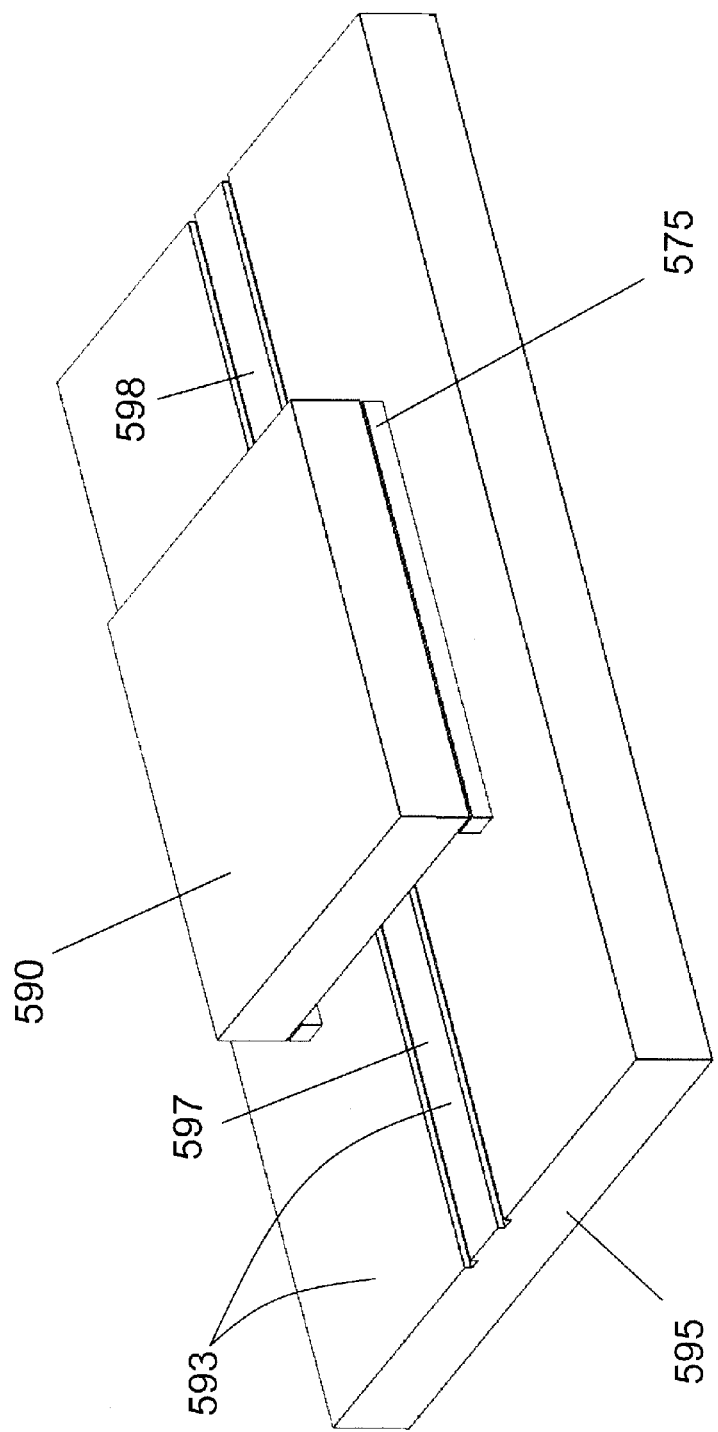
FIG. 6(c) illustrates an exemplary view of the field-effect transistor chip assembled onto a secondary substrate.

FIG. 6(c) illustrates the transistor sub-assembly where a transistor chip 590 has been attached to the secondary substrate 595. The standoffs 575 are visible and ensure that the chip 590 is positioned at a pre-determined distance from the surface 593 of the secondary substrate 595. The gate terminal trace 597 and drain terminal trace 589 are visible and are used to contact to the field-effect transistor sub-assembly.

Figure 7:
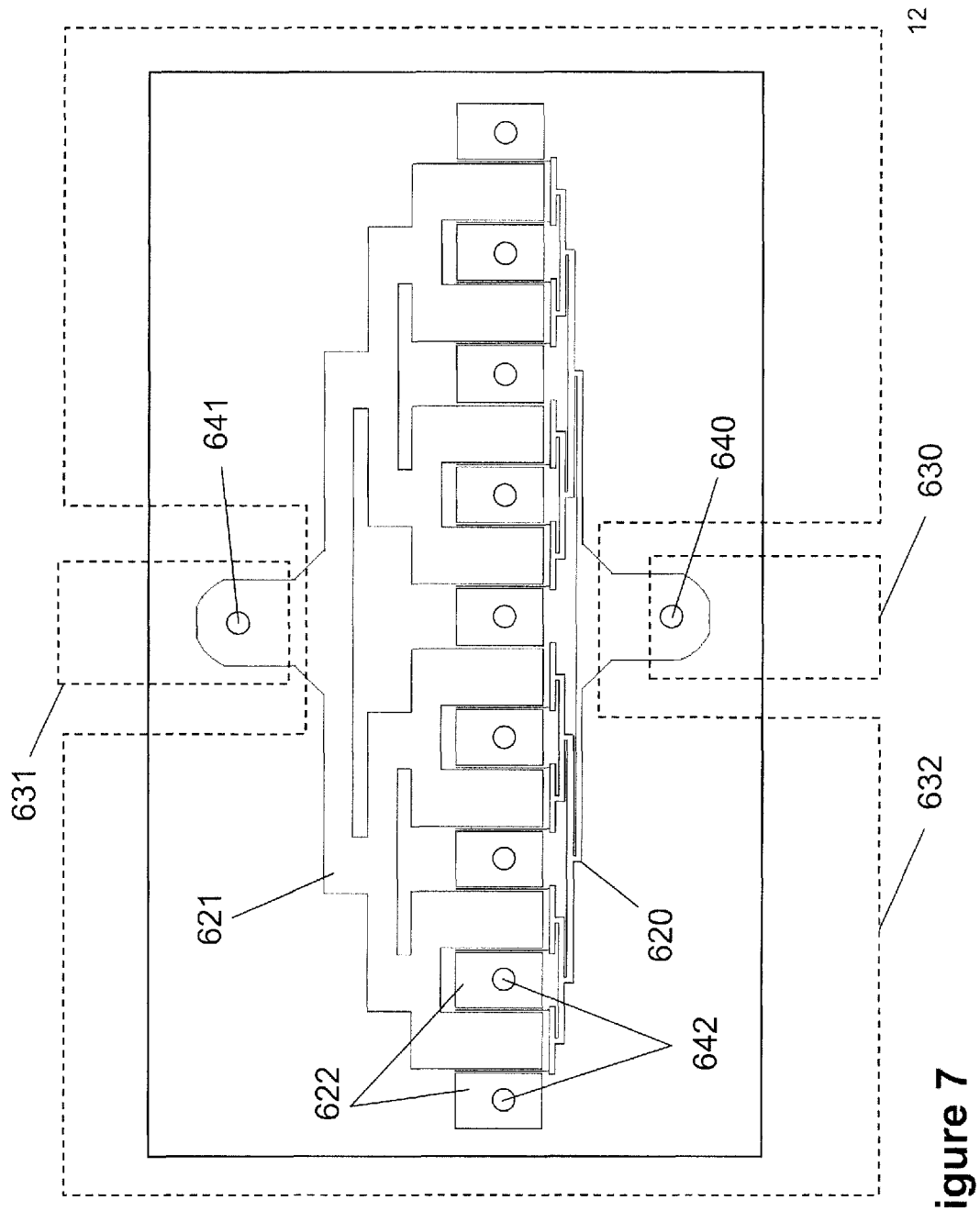
FIG. 7 illustrates another embodiment of the field-effect transistor with multiple gate fingers and the metallization on the secondary substrate superimposed.

FIG. 7 illustrates the present invention when a transistor with more than four gate fingers is contacted. The signal enters via the gate terminal trace 630 on the secondary substrate. It is electrically coupled to the gate terminal on the transistor using solder bump 640. The gate terminal on the transistor is a part of a gate electrical traces 620 having a binary tree architecture. The binary tree architecture ensures substantially equal electrical delay between the gate terminal (i.e., the solder bump 640) and the individual gate electrodes. The drain terminal traces 631 is electrically coupled to the drain traces 621 on the transistor chip via the solder bump 641. The drain electrical traces 621 also form a binary tree to facilitate an equal delay in the drain signals from the individual drain electrodes to the drain terminal of the sub-assembly. The individual source electrodes 622 are individually connected to the ground plane 632 on the secondary substrate via individual solder bumps 642. The signal electrical delay between the ground plane 632 proximal to the gate terminal trace 630 generally varies with the linear position of the source electrode, but its variation is minimized when the solder bumps are arranged in a linear array.

Figure 8A:
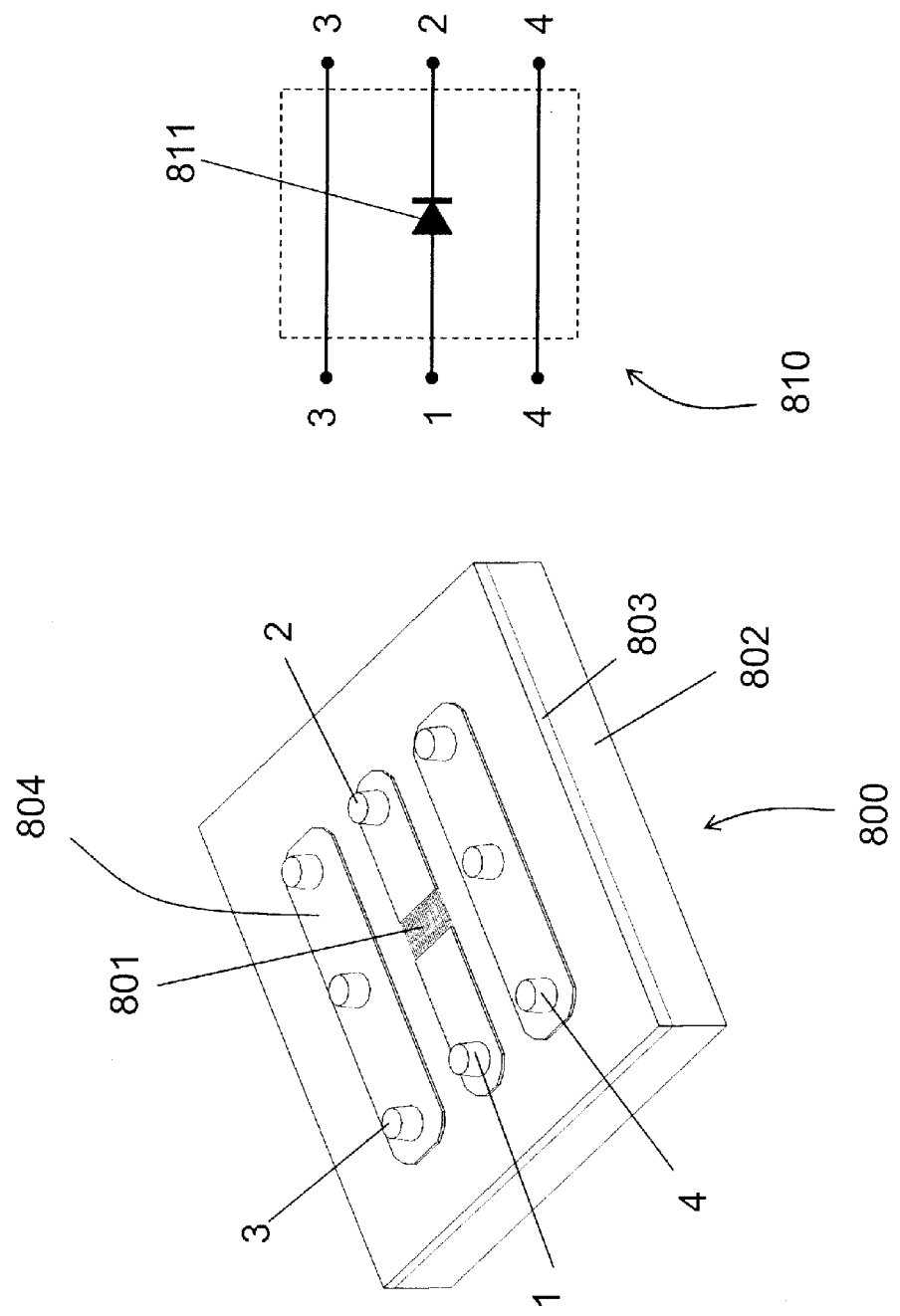
FIG. 8(a) shows one embodiment of the present invention applied to serially connected microwave diode.
Figure 9:
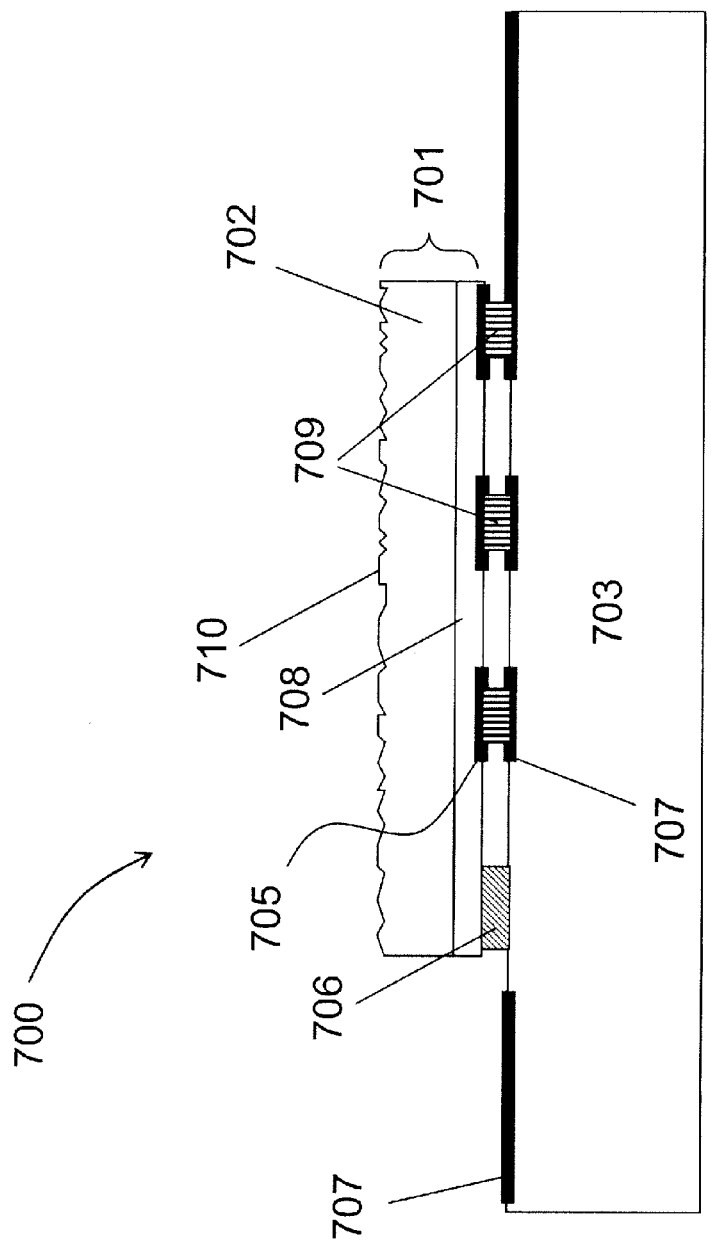
FIG. 9 is an illustration of flip-chip assembly of different embodiments.

Another embodiment of the present invention, schematically illustrated in FIG. 8(a), is a GaN-on-diamond chip 800 that contains at least one serially-connected switching diode 801 incorporated into a coplanar waveguide top of the chip 800. The chip 800 comprises of a diamond substrate 802 with a wide-gap-semiconductor-based epilayers 803 disposed in its top, contact metallization 804, solder bumps 1, 2, 3, and 4, and the serially connected microwave diode 801. In one embodiment, the wide-gap-semiconductor-based epilayer means a layered structure layer that contains at least one layer made out of gallium nitride. The top contacts to the diode are connected using solder bumps numbered 1, 2, 3, and 4 (in FIG. 8(a)) to a secondary substrate as is illustrated in FIG. 9. The equivalent circuit 811 shows the relationship between the connections 1, 2, 3, and 4 and the microwave diode switch 811. In another embodiment, the solder bumps 1, 2, 3, and 4 are realized on a second substrate.

Figure 8B:
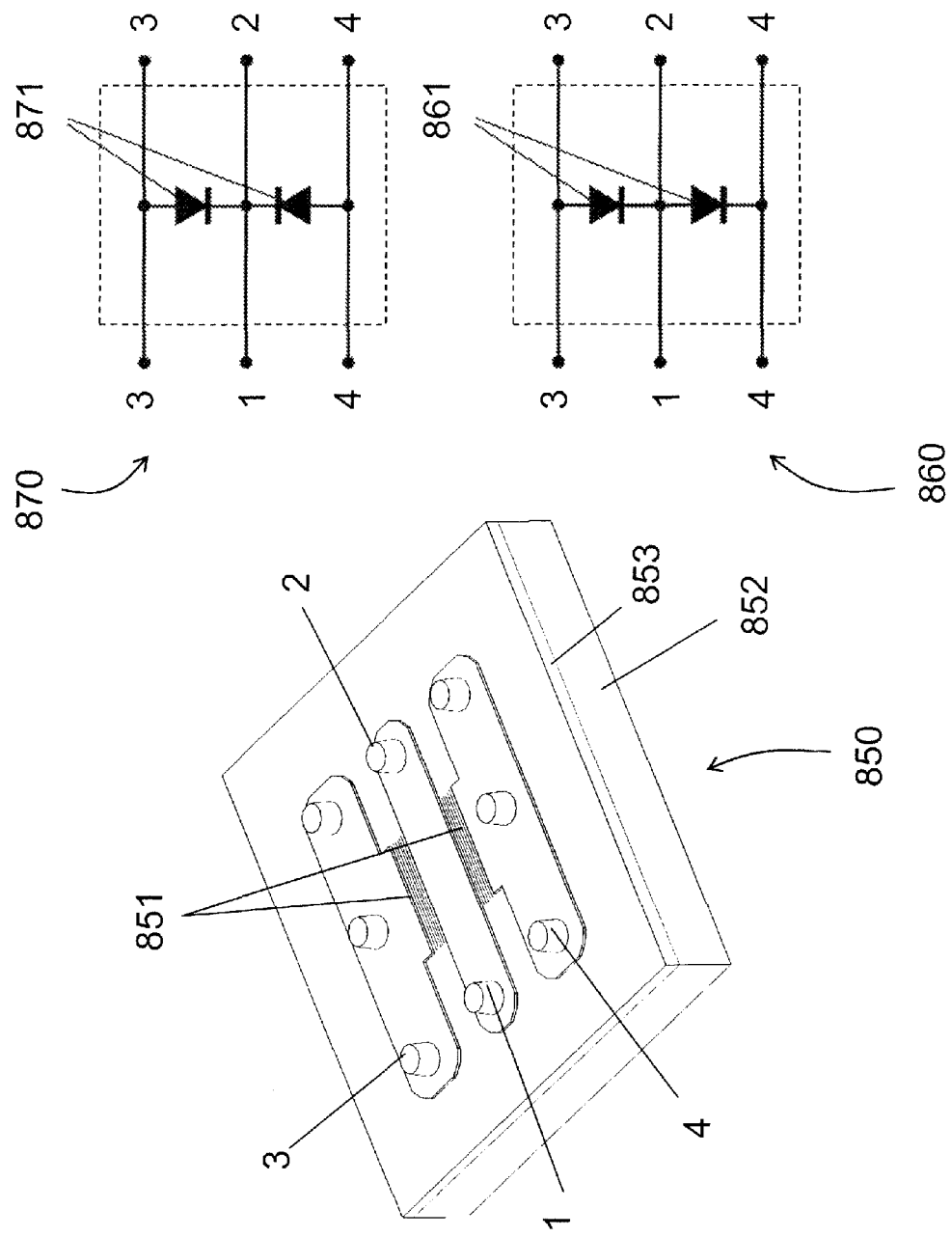
FIG. 8(b) shows one embodiment of the present invention applied to a shunt connected microwave diodes.

Another embodiment of the present invention, schematically illustrated in FIG. 8(b), is a GaN-on-diamond chip 850 that contains a two shunt-connected microwave diodes 851 incorporated into a coplanar waveguide top of the chip 850. The chip comprises of a diamond substrate 852 and a gallium-nitride-based epilayer 853. In one embodiment, the gallium-nitride-based epilayer means a layered structure layer that contains at least one layer made out of gallium nitride. In another embodiment, the epilayer 853 is made out of a wide-gap semiconductor material. The top contacts to the diode are connected using solder bumps numbered 1, 2, 3, and 4 (in FIG. 8(b)) to a secondary substrate as is illustrated in FIG. 9. There are two possible orientation embodiments of the microwave diodes and they are illustrated with the equivalent circuits 860 and 870, which show the relationship between the connections 1, 2, 3, and 4 and the microwave diodes 861 and 871, respectively. The location of the microwave diodes 871 or 861 are illustrated with the dashed areas 851 on top of the chip 850. In one embodiment, the chip 850 is a coplanar limiter diode chip. In another embodiment the chip 850 is a microwave switching diode chip.

FIG. 9 illustrates the completed sub-assembly 700 in which one or more chips 701 are attached using flip-chip technology to a secondary substrate 703. In one embodiment, the chip 701 comprises a layered structure layer 708 made out of at least one layer containing gallium nitride and a diamond substrate 702. In another embodiment, the layered structure layer 708 is made out of a wide-gap semiconductor material. The chip 701 has metal contacts 705 disposed on its surface proximal to the layered structure layer 708 and the secondary substrate 703 has metal contacts 707 disposed on its surface proximal to the chip 701. The metal contacts 705 and 707 are at least in some sections operatively configured to accept solder bumps 709 to facilitate an electrical contact between the traces 705 on the chip 701 and the traces 707 on the secondary substrate 703. The surface 710 of the diamond substrate 702 that is distal from the layer structure layer 708 is rough owing to the growth process of the diamond layer. In embodiments, the interface between the layered structure layer 708 and the diamond substrate 702 comprises a thin layer of silicon nitride. The standoff 706 is used to ensure that the chip 701 is located at a pre-determined distance from the secondary substrate 703.

Package for Flip-Chip Mounted High-Power GaN-on-Diamond Devices

Figure 10:
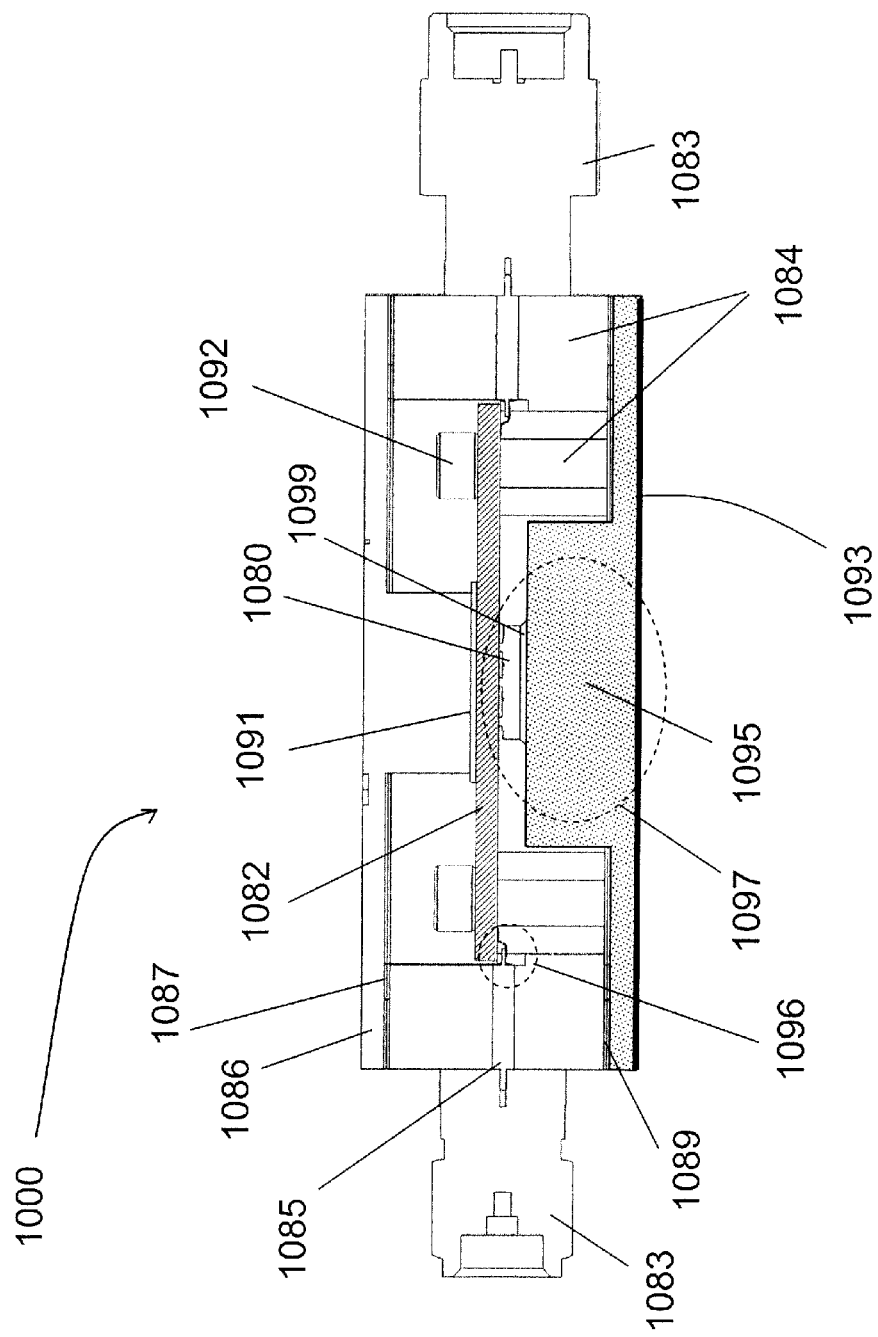
FIG. 10 shows an exemplary microwave package according to the present invention.

FIG. 10 illustrates an embodiment where a GaN-on-diamond device 1080 or more generally a wide-gap semiconductor device on diamond substrate (also represented with 1080) is packaged according to the present invention in a package with high thermal conductance between the device active area and the package external surface. The preferred package 1000 comprises of a gallium-nitride-on-diamond chip 1080 attached to a secondary substrate 1082 using flip-chip technology, the substrate 1082 is attached to the housing body 1084 using bolts 1092 and electrically coupled to at least one RF feed-through 1085 (there are two shown in the FIG. 10), at least one microwave connector 1083. The diamond substrate side of the chip 1080 is attached to a heatsink cover 1095 using solder 1099, while the back of the secondary substrate 1082 is optionally pressed against with a top lid 1086 with a moldable adhesive 1091.

In one embodiment, the package includes at least one heatsink gasket 1089 to accommodate for the dimensional variation (tolerances) in manufacturing between the housing body 1084, the GaN-on-diamond chip 1080 thickness, and other dimensions. The heatsink gasket thickness is selected during the manufacturing process. The tolerance accommodation is described below in more detail.

In another embodiment, a lid-gasket 1087 is included to accommodate the dimensional variation (tolerance stack-up) between the package housing 1084, substrate 1082 thickness and bow, moldable adhesive 1091, and the package lid 1086.

In yet another embodiment, the package lid 1086 includes a spring (not shown) that continually presses against the substrate 1082 from the top of the package providing continuous pressure on the substrate towards the heatsink cover.

Figure 11A:
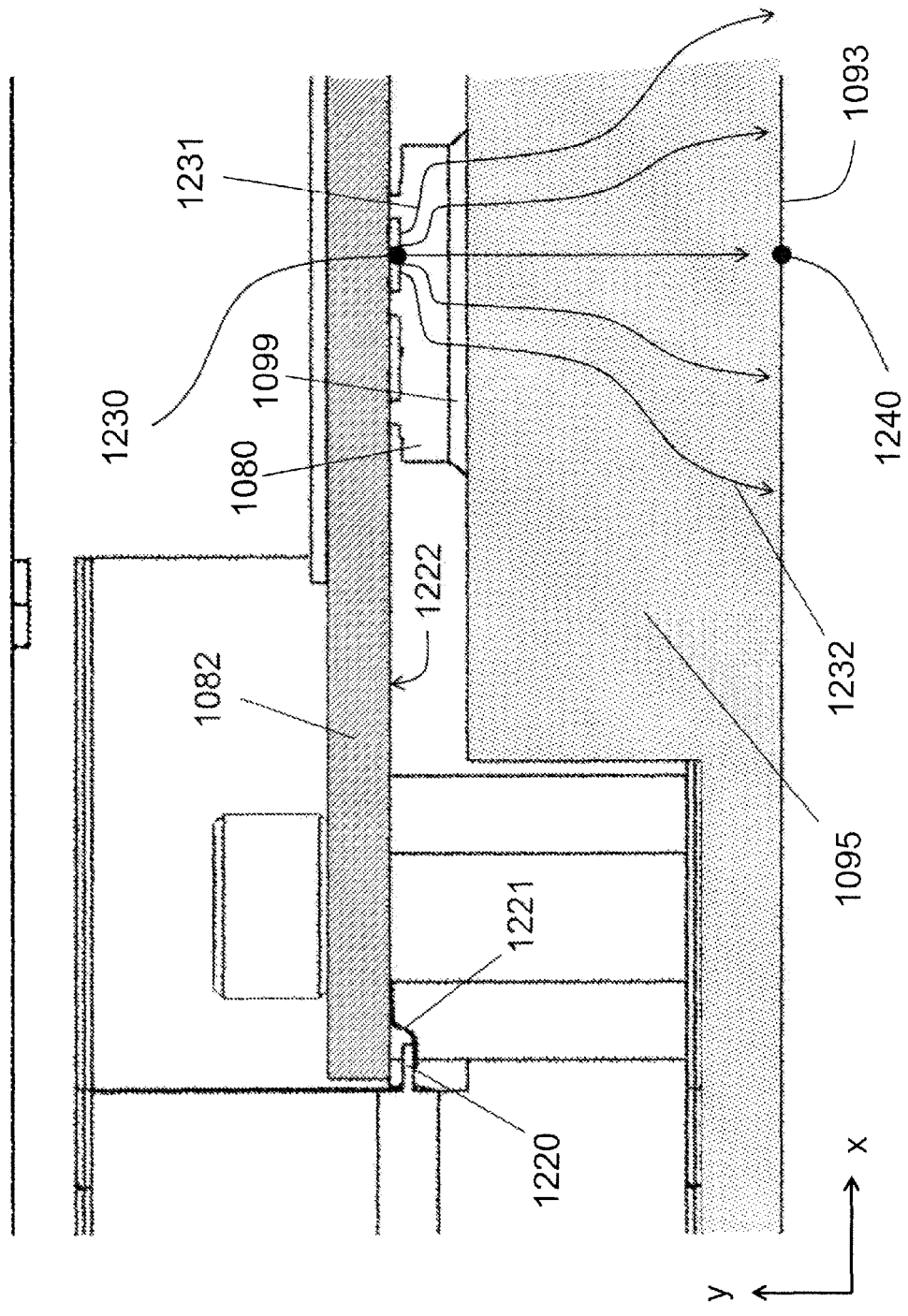
FIG. 11 is a magnified view of FIG. 10 illustrating (a) heat flow, and (b) mechanical tolerance analysis.
Figure 11B:
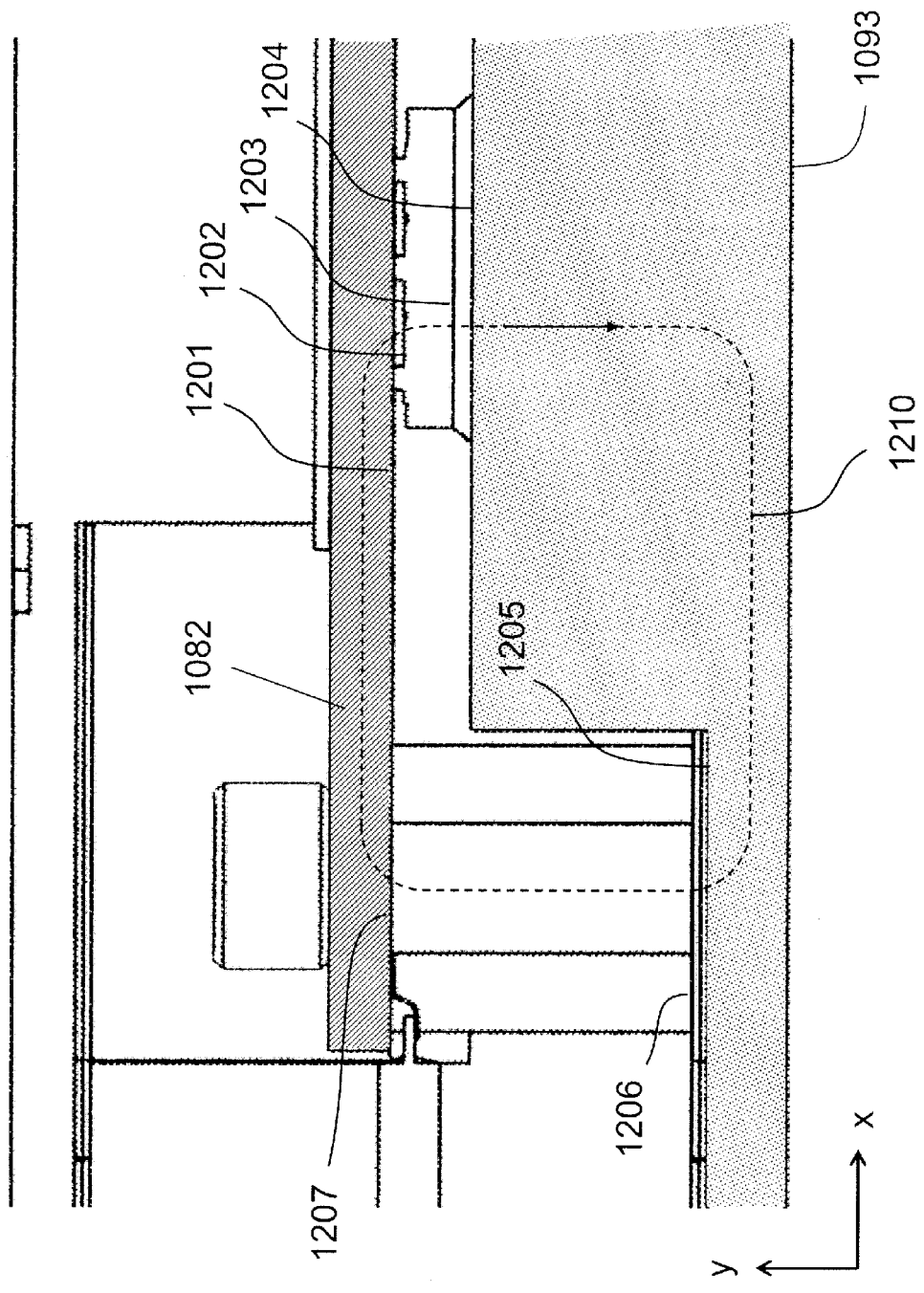

FIG. 11 shows the center area 1097 and the connector area 1096 of FIG. 10 magnified. FIG. 11(a) illustrates one embodiment of the present invention in which the which the signal electrical trace (not shown) on the bottom surface 1222 of the secondary substrate 1082 is electrically coupled the coaxial pin 1220 within the microwave connector 1083 by means of a welded flexible ribbon 1221. In another embodiment of the present invention the electrical traces (not shown) on the bottom surface 1222 of the secondary substrate 1082 are electrically coupled the coaxial pin 1220 within the microwave connector 1083 by means of mechanical contact. In another embodiment, the electrical traces (not shown) on the bottom surface 1222 are optionally soldered to the coaxial pin 1220. In one embodiment, the ground electrical traces on the bottom 1222 of the secondary substrate 1082 are electrically coupled to the housing body 1084 by mechanical contact. The firm mechanical contact is facilitated using bolts 1092 shown in FIG. 10.

In FIG. 11(*a*), the heat-generating area 1230 of the chip 1080 is characterized by a junction temperature at the location of the heat-generating area 1230. The package housing temperature is measured at a point 1240 the bottom of the heatsink cover 1095. The surface 1093 of the heatsink cover 1095 is attached to an external cold-plate or another heatsink (not shown). The arrows 1231 and 1232 illustrate the heat flow from the heat-generating area 1230, through the chip 1080, over the adhesive layer 1099, and is coupled to the heatsink cover 1095 to be finally delivered to the external heatsink (not shown) via the surface 1093 (shown in FIG. 10). In this embodiment the chip 1080 is made out of diamond and has a thin epitaxial layer on its surface which contains the electronic devices, in other words, the chip is a diamond heat-spreader, and hence the heat spreads more in the chip 1080 than it does in the heatsink cover 1095 below the chip as illustrated by the arrows 1231 in the chip 1080 and 1232 in the heatsink. This is a result of the fact that diamond heat-spreader is an integral part of the chip 1080 and has substantially larger thermal conductivity than the heatsink cover 1095.

The manufacturing-tolerance stack-up and thermal expansion that needs to be accommodated in the assembly of the preferred package shown in FIG. 10 is explained with the help of FIG. 11(*b*). Any machined or coined mechanical piece has nominal and actual dimensions. Nominal dimension is what the designer specified to be machined, while the actual dimension is what the machine shop or a coning equipment made. The actual dimensions are random variables and their bounds are specified by dimensional tolerances, typically, minimum and maximum dimension specifications. When such real components are used to make a larger assembly, the variations in the dimensions in each of the components add up to give rise to dimensional tolerance of the complete assembly. The word "mechanical-tolerance stack-up" means the sum of all dimensions in a mechanical structure counting on the worst-case variation of each dimension of each elements in the structure. Mechanical tolerance stack-up can be expressed in terms of the worst-case and the best-case dimension. Thermal expansion is a inherent characteristics of all materials in which solid dimensions change with temperature. This process is generally deterministic and reversible, but it has to be accounted for in any mechanical design that anticipates temperature variation. High-power microwave circuits operate over a wide range of temperatures and have to be designed in such a way that at the coldest and the hottest temperature they do not lose their mechanical stability, namely, they do not break or crack. Any practically mechanical design much account for both of these phenomena: thermal expansion and manufacturing tolerances.

In order to realize consistent and high-thermal-conductivity thermal contact between the heat source 1230 and the heatsink cover 1095, the heat path described with the arrows 1231 and 1232 requires consistent high conductance heat path with low thermal contact resistances [11] between the different surfaces in the package. Such a thermal contact is realized using tight mechanical contact and the use of highly thermally conductive materials to manufacture the package. In order to maintain tight mechanical contact at all operating temperatures and for all dimensional variations in package manufacturing, the tolerances and the thermal expansion along the loop 1210 have to be accounted for: The strain accumulated along the path 1210 has to remain below fracture energy of the weakest element in the loop 1210. Clearly, the weakest element is the flip-chip bonded chip and the solder bumps.

In more detail, the tolerance stack up comprises of the flip-chip bonding clearance—the distance between bottom surface 1201 of the secondary substrate 1082 and the top surface 1202 of the GaN-on-diamond chip 1080, the distance between the surface 1202 and the back surface 1203 of the chip 1080 (i.e. the thickness of the GaN-on-diamond chip 1080), the distance between the back surface 1203 of the chip 1080 to the top surface 1204 of the heatsink 1095 (the thickness of the solder), the machining tolerance between the two levels on the heatsink—levels 1205 and 1204, the thickness of the gaskets (level 1206 minus level 1205), the machining tolerance in the thickness of the housing body (i.e. level 1207 minus level 1206), and finally the bow in the secondary substrate: level 1207 minus level 1201.

In one embodiment, prior to the insertion of the gasket 1089, the distance $t_{meas}$, which is level 1206 minus level 1205, is measured using a method known in the art for precision measuring of mechanical height and separation. The distance $t_{meas}$ is made to always come out greater than zero by design, which accounts for the worst-case dimensional variation of each element, the worst-case addition of the tolerance in the loop 1210, and the worst-case thermal expansion effects, hence $t_{meas}>0$. This distance ($t_{meas}$) is the thickness that is missing to perfectly close the package and is realized/compensated in two ways: a gasket (or more than one gasket) 1089 is selected from a set of gaskets (also referred to as shims or foils) with discrete thicknesses so that the largest discrete thickness or sum of gasket thicknesses $t_{gasket}$ is smaller than the required dimension $t_{meas}>t_{gasket}$. By inserting the specified gaskets the missing dimension has been reduced to at most the increment in the gasket size $t_{inc}$. Metal gaskets can be made out of copper, brass, or aluminum or any other suitable metal. An example of commercially available foil thicknesses are 1, 5, 8, 10 mils and larger. In this exemplary set of gasket sizes, the increment can be made equal to $t_{inc}=1$ mil. Upon inserting the desired gaskets into the package, the remaining thickness is approximately equal or smaller than $t_{inc}$.

Figure 13:
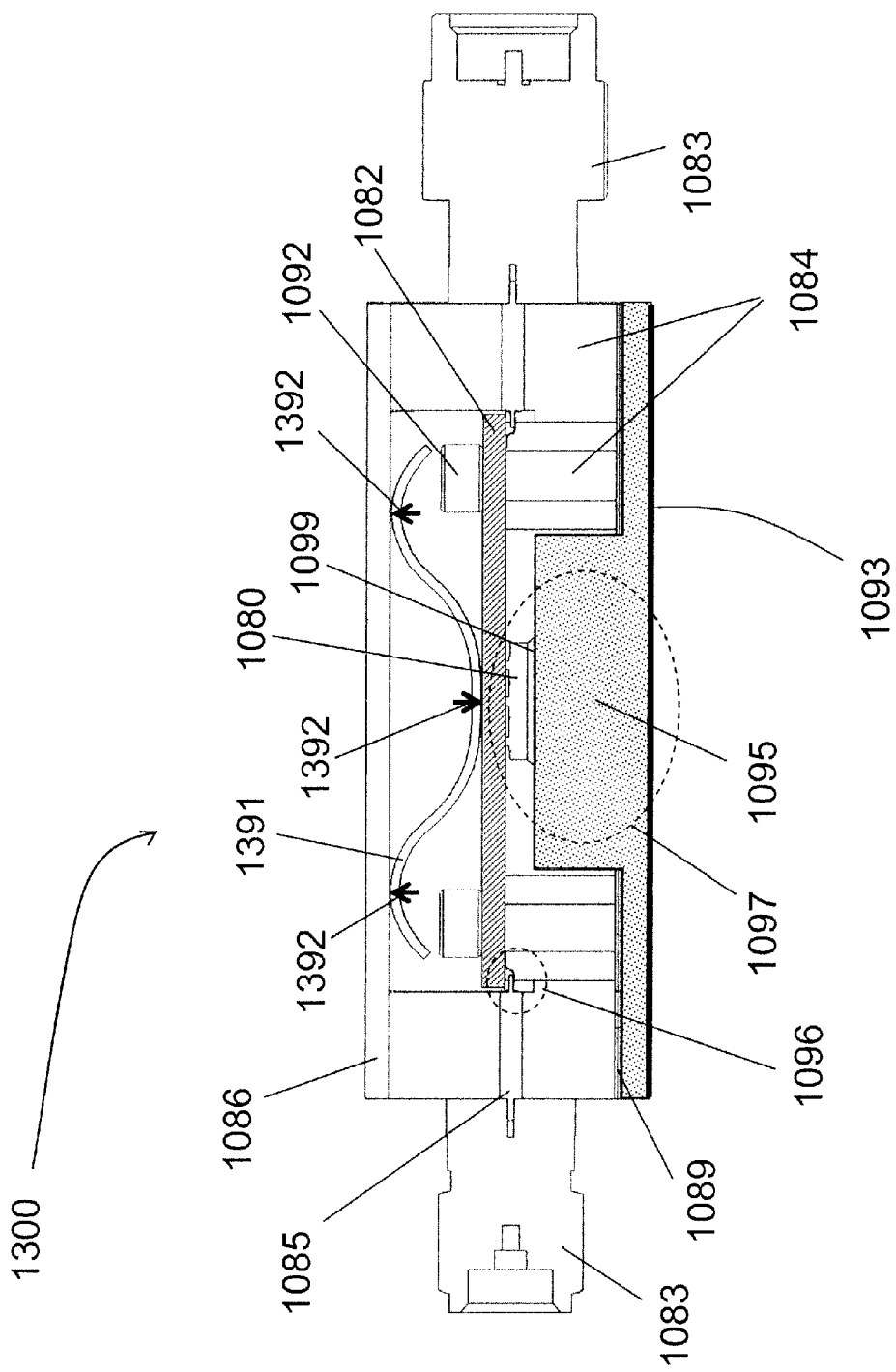
FIG. 13 illustrates an exemplary microwave package using a spring.

The remaining missing dimension ($t_{inc}$) is sufficiently small that it can be accommodated with the bow of the substrate 1082. In one embodiment, the forced bow of the substrate 1082 is used to exert continuous pressure on the thermal contact between the chip 1080 and the heatsink cover 1095. In another embodiment, schematically illustrated in FIG. 13, the forced bow is realized by applying a spring between the top surface of the substrate 1082 and the package lid 1086. FIG. 13 illustrated a cross-section through an embodiment employing a spring 1391 to maintain pressure on the substrate 1082 at all times. The package 1300 comprises functionally identical elements as the embodiment illustrated in FIG. 10 with the exception that it does not use lid gaskets (show by 1087 in FIG. 10) and moldable adhesive (shown by 1097 in FIG. 10). Instead, a spring 1391 is inserted between the package lid 1086 and the substrate 1082. The spring 1391 maintain constant pressure on the substrate 1082 behind the chip 1080 and presses against the lid 1086. The locations where force is exerted are denoted with arrows 1392. In one embodiment, the spring maintains pressure between the substrate 1082 and a suitably designed ledge on the package body 1084.

Figure 12:
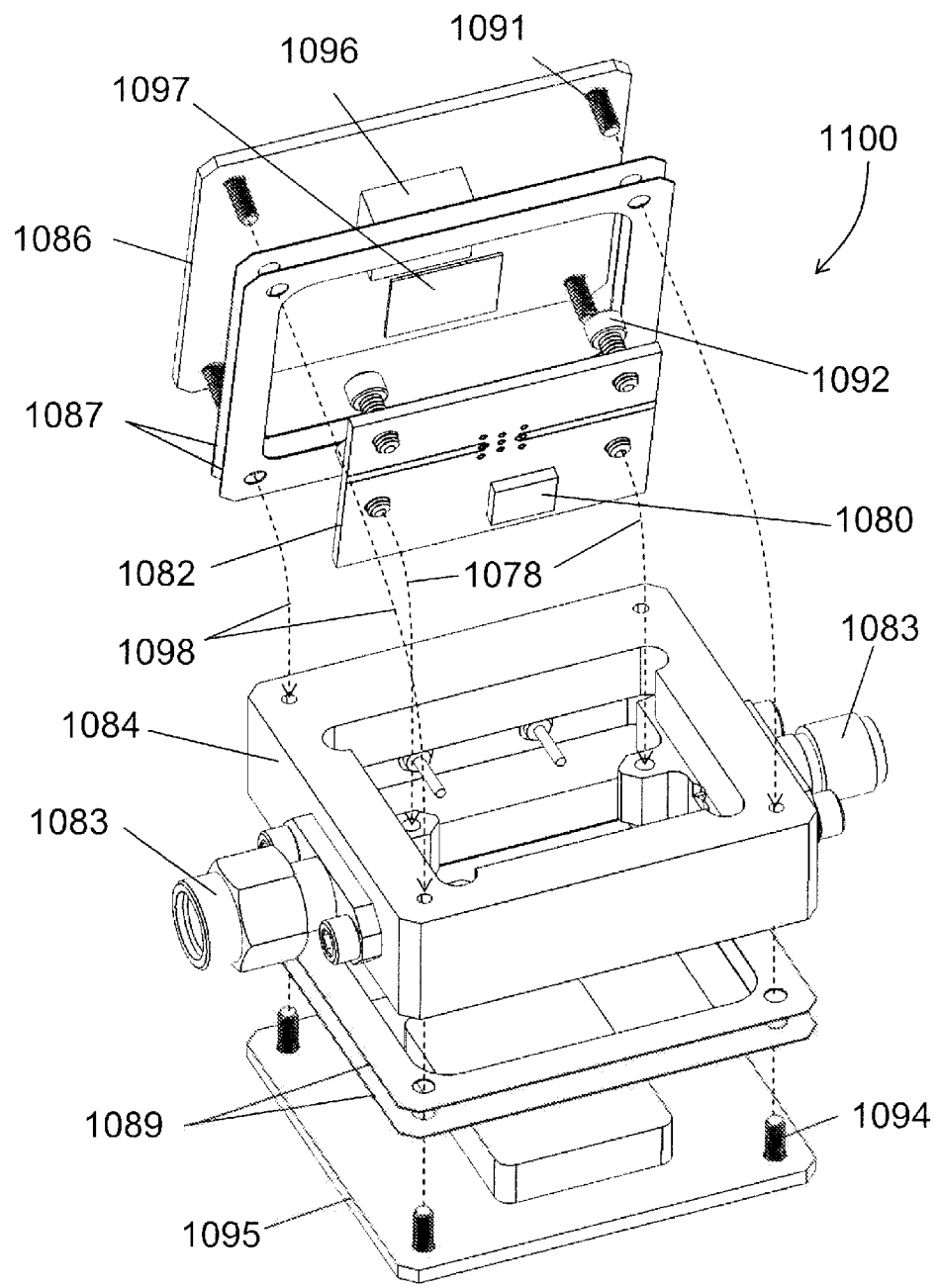
FIG. 12 shows an exploded view of the exemplary package shown in FIG. 10.

FIG. 12 illustrates the principle of assembly of the package according to one embodiment of the present invention. The GaN-on-diamond chip 1080 is flip-chip mounted onto the substrate 1082. The substrate 1082 is inserted into the package body 1084 and bolted using bolts 1092 against the ground and RF connector pin (protruding from the connectors 1083). The heatsink cover 1095 is inserted into the package body 1084 without the gaskets 1089. The missing distance is noted. There is more than one way of determine this distance by making more than one measurement. Suitable set of gaskets 1089 is selected and inserted between the package body 1084 and the heatsink cover 1095. The heatsink cover 1095 is secured to the package body using bolts 1094. In one embodiment, the package lid 1086 is inserted from the top of the package 1084 and the missing distance to close the package is noted. A suitable set of lid gaskets 1087 is inserted to and a flexible sheet 1097 is inserted to accommodate for thermal expansion and last amount of tolerance. In one embodiment, the substrate 1082 is flexible to accept a forced bow with maximum protrusion equal or less than $t_{inc}$. The package lid 1086 is bolted to the package body 1084 using bolts 1091.

Figure 14:
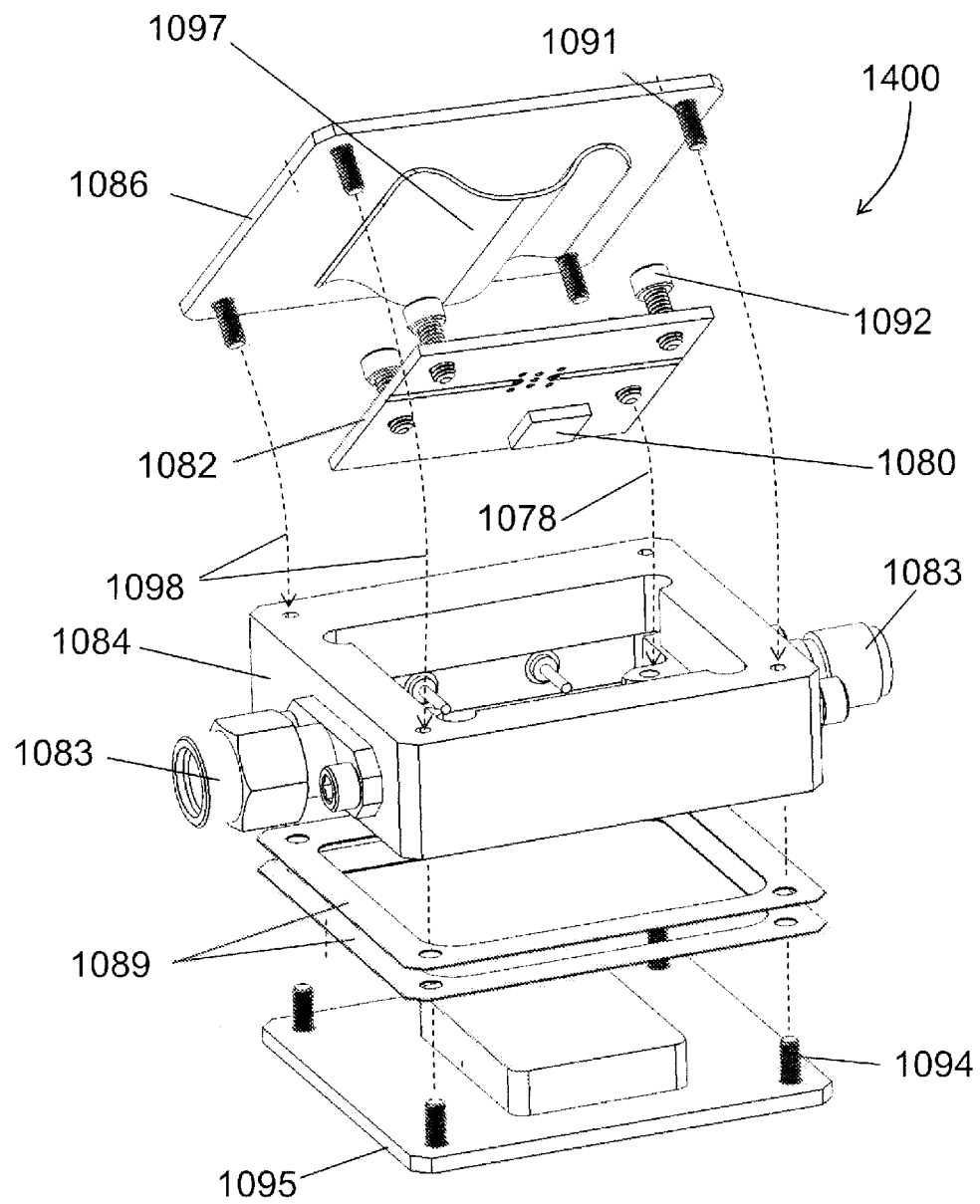
FIG. 14 shows an exploded view of the exemplary package from FIG. 13.

FIG. 14 illustrates the principle of assembly of the package utilizing a spring to maintain pressure on the substrate 1082. The GaN-on-diamond chip 1080 is flip-chip mounted onto the substrate 1082. The substrate 1082 is inserted into the package body 1084 and bolted using bolts 1092 against the ground and RF connector pin (protruding from the connectors 1083) along a direction indicated with the dashed arrow 1078. The heatsink cover 1095 is inserted into the package body 1084 without the gaskets 1089. The missing distance is noted. There is more than one way of determine this distance by making more than one measurement. Suitable set of gaskets 1089 is selected and inserted between the package body 1084 and the heatsink cover 1095. The heatsink cover 1095 is secured to the package body using bolts 1094. In one embodiment, the substrate 1082 is flexible to accept a forced bow with maximum protrusion equal or less than $t_{inc}$. A spring 1097 is inserted into the package and covered by the package lid. The package lid 1086 is bolted to the package body 1084 using bolts 1091. The spring 1097 maintains pressure between the package lid 1086 and the substrate 1082 back to maintain thermal contact between the chip 1080 and the heatsink cover 1095.

Reinforcement of the Substrate

Figure 15:
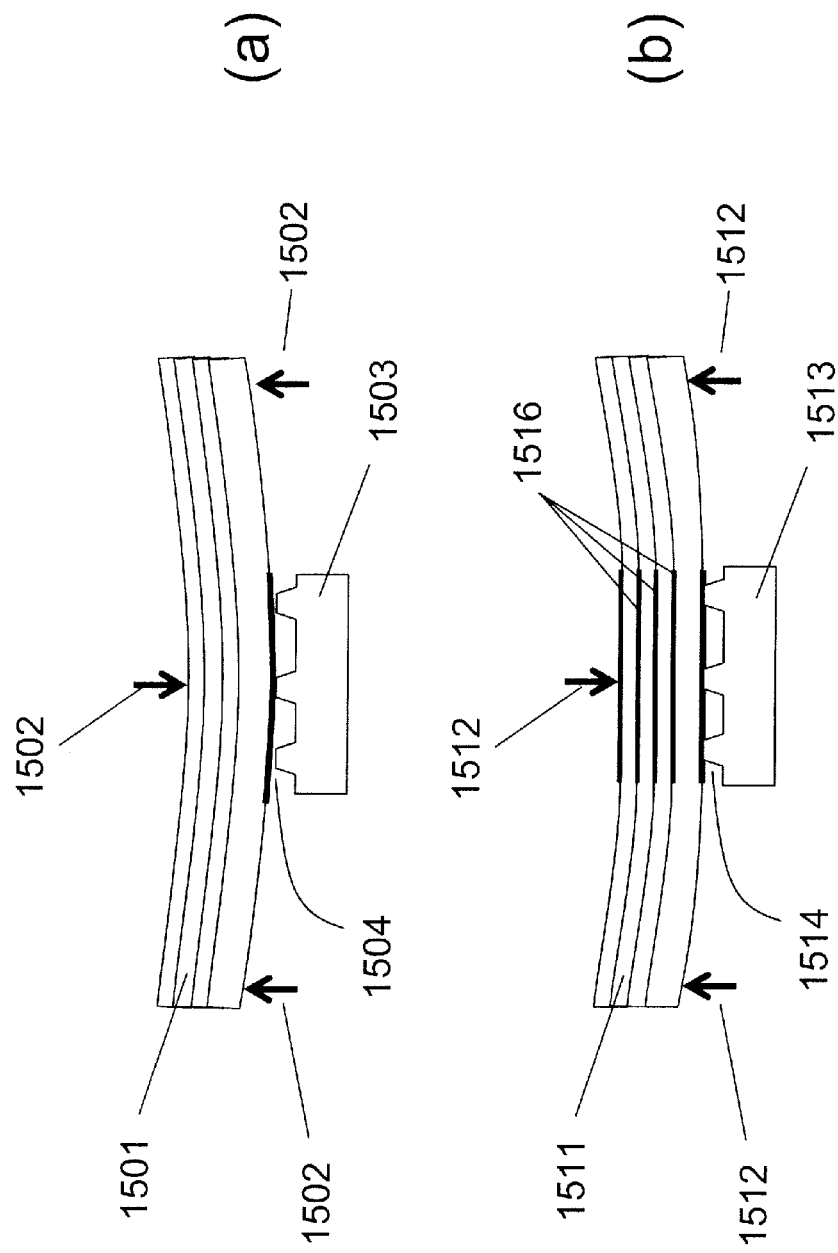
FIG. 15 is an illustration of a substrate locally reinforced to exhibit different Young's modulus in laterally defined regions.

In one embodiment, the substrate 1082 is made out of a laminate that is reinforced in the region where the surface of laminate has to be flat to maintain solid support for the flip-chip mounted chip. This embodiment is explain with the help of FIG. 15.

FIG. 15(a) shows a laminate substrate 1501 with a flip-chip mounted chip 1503. While in the package, the laminate is under pressure from at least three points indicated with arrows 1502. Since the surface of the chip 1503 is flat and the surface of the laminate bowed under pressure. It is possible that the solder bumps on the chip will detach and leave a gap 1504. FIG. 15(b) shows a preferred embodiment in which the laminate 1511 is reinforced with metal 1516 only in the regions where the chip 1513 is to be mounted. When at last three points of pressure appear indicated with the arrows 1512, this results in a flat segment 1514 in otherwise bowed laminate 1511 and reduces the stress on the solder bumps, thereby increasing the reliability of the assembly.

In another embodiment, a semiconductor device assembly comprises a substrate having a semiconductor device chip disposed on its top surface, said chip mounted by flip-chip process, said substrate having a first laterally-defined region having first stiffness and a second laterally defined region having a second stiffness, wherein said first stiffness is higher than said second stiffness. The regions of different stiffness can also be described as regions having different Young's modulus of elasticity and different Poisson ratio.

Figure 16:
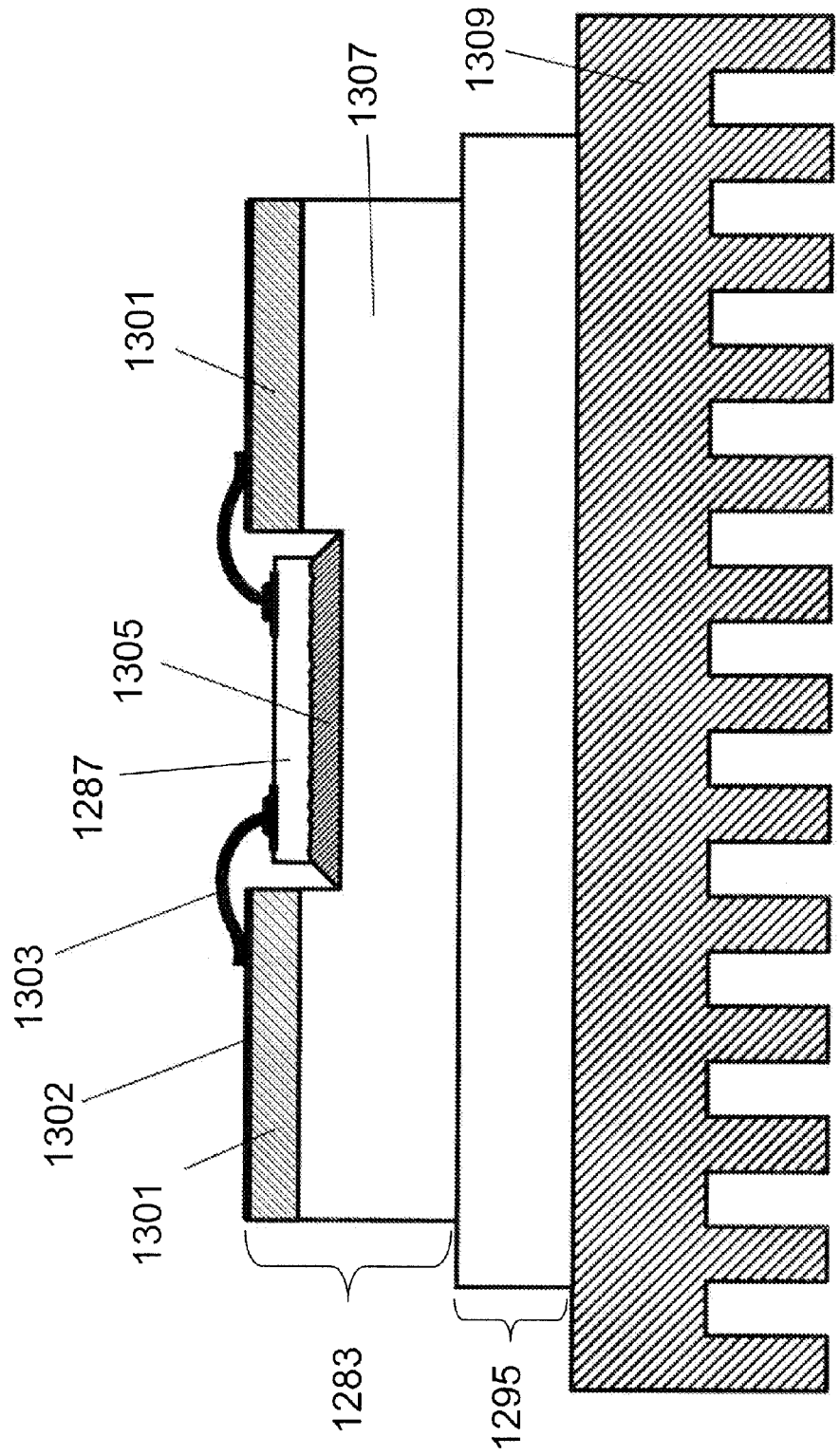
FIG. 16 shows an exemplary view of an embodiment showing a wire-bonded GaN-on-diamond chip on a heatsink.
Figure 17:
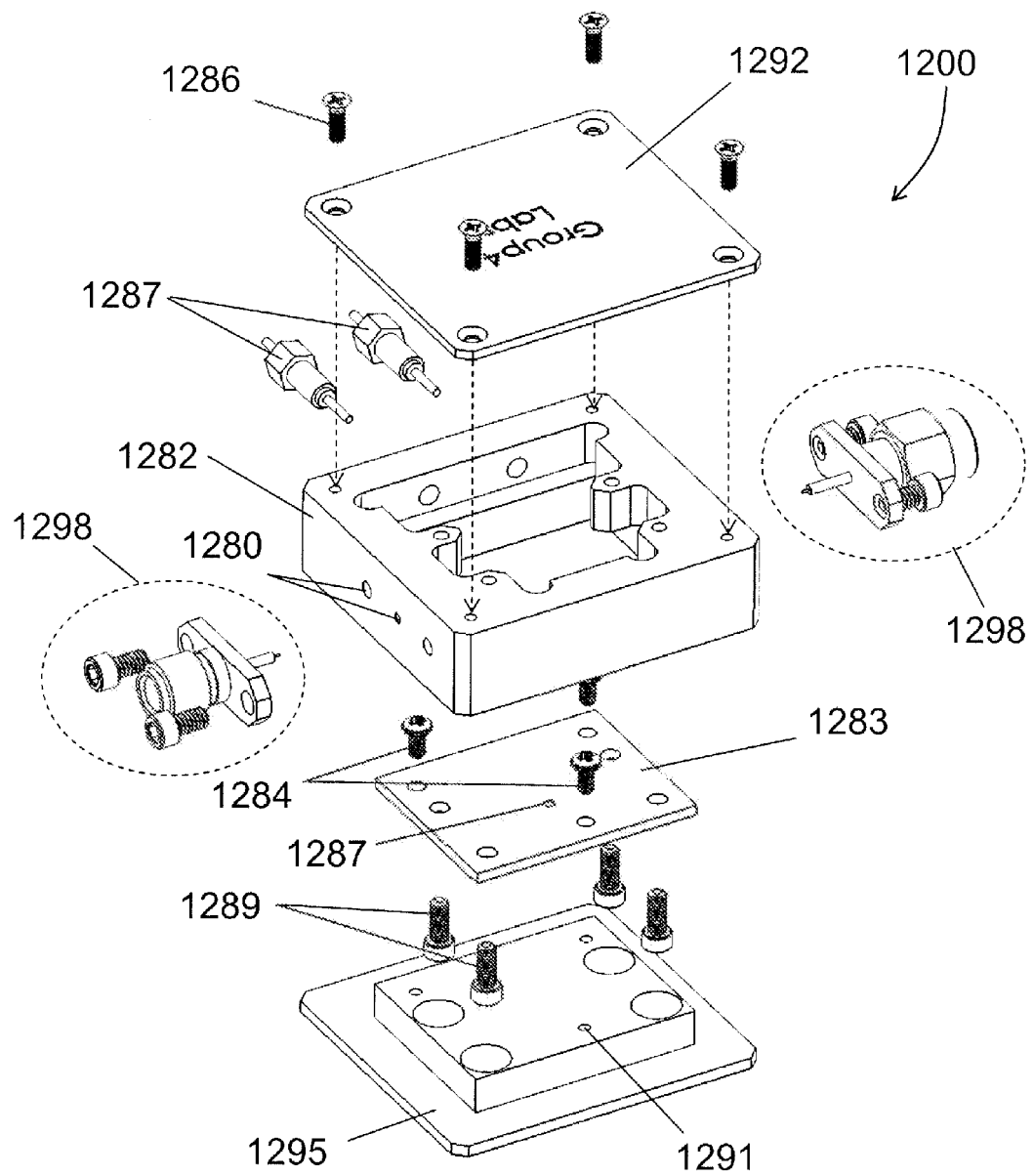
FIG. 17 shows an exploded view of a package with substrate-down mounting.

Substrate-Down Packaging with High-Thermal Conductance and High Signal Integrity In another embodiment, the principle of which is illustrated in FIG. 16 and FIG. 17, the electronic device chip 1287 is mounted with substrate down on an amplifier substrate 1283 using either silver epoxy or solder 1305. The amplifier substrate 1283 is illustratively shown as comprising of a dielectric 1301 and a metal cladding 1307. Metal traces 1302 are disposed on the top surface of the amplifier substrate 1283. At least some metal traces 1302 are electrically coupled to the electrical device chip 1287 via bond-wires 1303. In one embodiment, the back of the amplifier substrate 1283 is thermally coupled to a heatsink cover 1295. the heatsink cover also serves as a amplifier package cover as will be shown in FIG. 17. the electronic device chip 1287 may be an microwave integrated circuit, or it may comprise at least one transistor, diode, or any electronic device. The heatsink cover 1295 is thermally coupled to an external heatsink 1309 which is cooled using convection or conduction. On one embodiment, the heatsink cover 1295 is omitted and the amplifier substrate 1283 is directly attached to the external heatsink 1309 for thermal coupling.

FIG. 17 illustrates the preferred packaging embodiment 1296 for the amplifier substrate 1283. In the preferred embodiment, at least one electronic device chip 1287 is disposed on the amplifier substrate 1283. The package 1296 comprises the package body 1282, heatsink cover 1295, the amplifier substrate 1283, the lid 1292, at least one RF connector 1298 (two are shown in FIG. 17), associated assembly bolts (1286, 1284, 1289) and optional low-frequency connections 1287. The RF connectors 1298 are inserted and bolted to the body 1282 via holes 1280. The RF signal and ground connections to the amplifier substrate 1283 are realized by pressing the grounded body 1282 of the package and the center pin of the RF connector 1298 against the top surface of the amplifier substrate 1283 by inserting the amplifier substrate 1283 into the body 1282 from below (as visible from the FIG. 17) and tightening the amplifier substrate 1283 against the package body 1282 using bolts 1289. The pressure from bolts 1289 ensures that both the ground and the RF signal are firmly pressed against the conductive package body 1282 with no requirement for height tolerance, except flatness of the mating surface between the package body 1282 and the amplifier substrate 1283. By using described coplanar RF connections, the preferred embodiment ensures high signal integrity. The thermal connection is accomplished by pressing the heatsink cover 1295 against the bottom surface of the amplifier substrate 1283 and tightening the bolts 1284. In the preferred embodiment, the bolts 1284 tighten the amplifier substrate to the heatsink cover. Therefore, the amplifier substrate is mechanically coupled to the package body 1282 for RF connections and mechanically coupled to the heatsink cover 1295 using different set of bolts. This physical arrangement reduces the requirements on the machining tolerances and hence results in superior RF signal integrity and excellent thermal contact without the need for expensive components and tolerances.

While certain representative embodiments and details have been shown for purposes of illustrating the invention, it will be apparent to those skilled in the art that various changes in the methods and apparatus disclosed herein may be made without departing from the scope of the invention which is defined in the appended claims.

What is claimed is:

1. An electronic device assembly comprising:
   (a) a substrate having a top surface and a bottom surface, said top surface having an electrical trace, said substrate having an amount of bow defined as the maximum distance from any place on said top surface to a plane defined by the average height of the perimeter of said top surface;
   (b) a wide-gap semiconductor device chip having a contact surface and a back surface, said contact surface of said semiconductor device chip mechanically attached by flip-chip bonding to said top surface of said substrate and said semiconductor device chip electrically coupled to said electrical trace;
   (c) a package housing body in mechanical contact with said top surface of said substrate and not in mechanical contact with said semiconductor device chip, said package body having an electrical terminal electrically coupled to said electrical trace;
   (d) a package cover in thermal contact with said back surface of said semiconductor device chip;
   (e) a package lid;
   (f) at least one metal foil having a thickness disposed between said package body and said package cover, and
   (g) at least one bolt passing through the substrate, packaging housing body and at least one metal foil to the package cover such that the bolt provides firm mechanical contact between the substrate packaging housing body and at least one metal foil and the package cover, wherein said thickness of the at least one foil is selected so said amount of bow is at most 50 micrometers at 23° C.

2. The electronic device assembly of claim 1, wherein a solder contact provides the thermal contact between said package cover and said back surface of said semiconductor device chip.

3. The electronic device assembly of claim 1, wherein said semiconductor device chip includes at least one layer of wide-gap semiconductor disposed on synthetic diamond.

4. The electronic device assembly of claim 3, wherein said wide-gap semiconductor is gallium nitride.

5. The electronic device assembly of claim 1, wherein said semiconductor device chip is selected from the group consisting of a high-electron mobility transistor chip, a monolithic microwave integrated circuit chip, a high-power limited diode chip, and a high-power switching diode chip.

6. The electronic device assembly of claim 1, wherein said substrate is a multilayered laminate having a plurality of laterally defined regions of different modulus of elasticity.

7. The electronic device assembly of claim 6, wherein said regions of different modulus of elasticity are formed with a multilayered laminate with laterally-defined regions having different numbers of metalized layers.

8. The electronic device assembly of claim 1, further comprising:
   a spring disposed between said package lid and said bottom surface of said substrate, wherein said spring is under compression.

9. A semiconductor device package comprising:
   (a) a substrate having a semiconductor device chip attached to its front surface, a metal trace disposed on said front surface, said metal trace electrically coupled to said semiconductor device chip;
   (b) a package body in mechanical contact with said front surface of said substrate and having a terminal electrically coupled to said metal trace; and
   (c) a package heatsink in direct thermal contact with said substrate, wherein said heatsink is mechanically fastened to said substrate; and wherein said substrate includes a dielectric layer proximal to said front surface of said substrate and a metal cladding distal to said front surface of said substrate, said front surface including an opening in said dielectric layer which exposes said metal cladding and said semiconductor device chip attached to said metal cladding within said opening in said dielectric.

10. The package of claim 9, wherein said semiconductor device chip is selected from the group consisting of a high-electron mobility field-effect transistor chip, a high-power limiter diode chip, a switching diode chip, and a monolithically integrated microwave circuit chip.

11. The package of claim 9, wherein said semiconductor device chip includes at least one layer of wide-gap semiconductor disposed on synthetic diamond.

12. The package of claim 11, wherein said wide-gap semiconductor is gallium-nitride.

13. The package of claim 9, wherein said semiconductor device is coupled to said metal trace using flip-chip bonding.

14. An electronic device assembly comprising:
   (a) a substrate having a top surface and a bottom surface, said top surface having an electrical trace, said substrate having an amount of bow defined as the maximum distance from any place on said top surface to a plane defined by the average height of the perimeter of said top surface;
   (b) a wide-gap semiconductor device chip having a contact surface and a back surface, said contact surface of said semiconductor device chip mechanically attached by flip-chip bonding to said top surface of said substrate and said semiconductor device chip electrically coupled to said electrical trace;
   (c) a package housing body in mechanical contact with said top surface of said substrate and not in mechanical contact with said semiconductor device chip, said package body having an electrical terminal electrically coupled to said electrical trace;
   (d) a package cover in thermal contact with said back surface of said semiconductor device chip;
   (e) a package lid;
   (f) at least one metal foil having a thickness disposed between said package body and said package cover, and
   (g) wherein mechanical contact is provided between the substrate packaging housing body and at least one metal foil and the package cover, and wherein said thickness of the at least one foil is selected so said amount of bow is at most 50 micrometers at 23° C.

* * * * *